US011710590B2

(12) United States Patent
Mizuno et al.

(10) Patent No.: US 11,710,590 B2
(45) Date of Patent: Jul. 25, 2023

(54) SUPERCONDUCTING COIL DEVICE AND METHOD FOR PRODUCING SAME

(71) Applicants: RAILWAY TECHNICAL RESEARCH INSTITUTE, Kokubunji (JP); RIMTEC CORPORATION, Tokyo (JP)

(72) Inventors: Katsutoshi Mizuno, Kokubunji (JP); Minoru Tanaka, Kokubunji (JP); Masaki Takeuchi, Tokyo (JP)

(73) Assignees: RAILWAY TECHNICAL RESEARCH INSTITUTE, Tokyo (JP); RIMTEC CORPORATION, Tokyo (JP)

( * ) Notice: Subject to any disclaimer, the term of this patent is extended or adjusted under 35 U.S.C. 154(b) by 838 days.

(21) Appl. No.: 16/609,375

(22) PCT Filed: May 10, 2018

(86) PCT No.: PCT/JP2018/018067
§ 371 (c)(1),
(2) Date: Oct. 29, 2019

(87) PCT Pub. No.: WO2018/207861
PCT Pub. Date: Nov. 15, 2018

(65) Prior Publication Data
US 2020/0058425 A1    Feb. 20, 2020

(30) Foreign Application Priority Data

May 11, 2017    (JP) ................. 2017-094442

(51) Int. Cl.
*H01F 6/06* (2006.01)
*C08G 61/08* (2006.01)
(Continued)

(52) U.S. Cl.
CPC ............... *H01F 6/06* (2013.01); *C08G 61/08* (2013.01); *H01F 6/04* (2013.01); *C07F 15/0046* (2013.01);
(Continued)

(58) Field of Classification Search
USPC ........................................................ 335/216
See application file for complete search history.

(56) References Cited

U.S. PATENT DOCUMENTS 5,178,072 A * 1/1993 Suzuki .................... B60L 13/10
                                                         104/294
5,512,867 A    4/1996 Shibuta et al.
2005/0043541 A1    2/2005 Walter et al.

FOREIGN PATENT DOCUMENTS

EP    0507283 A1    10/1992
JP    8-267495 A    10/1996
(Continued)

OTHER PUBLICATIONS

Extended (Supplementary) European Search Report dated Aug. 21, 2020, issued in counterpart application No. 18797850.7. (10 pages).
(Continued)

*Primary Examiner* — Fred M Teskin
(74) *Attorney, Agent, or Firm* — WHDA, LLP

(57) ABSTRACT

A superconducting coil device (10) includes: a coil case (20) housing a superconducting coil (30); a superconducting coil (30) housed in the coil case (20); and a resin part (50) formed of a polymer (51) filled in a gap between an inner wall of the coil case (20) and the superconducting coil (30). The resin part (50) is formed of a polymer (51) obtained by polymerizing a polymerizable composition containing a first monomer having a norbornene ring structure.

10 Claims, 16 Drawing Sheets

(51) Int. Cl.
*H01F 6/04* (2006.01)
*C07F 15/00* (2006.01)
*G01R 33/12* (2006.01)
*H01F 6/00* (2006.01)

(52) U.S. Cl.
CPC .......... *C08G 2261/3322* (2013.01); *C08G 2261/3324* (2013.01); *G01R 33/1238* (2013.01); *H01F 6/006* (2013.01)

(56) References Cited

FOREIGN PATENT DOCUMENTS

| JP | 10-315267 A | 12/1998 |
|---|---|---|
| JP | H10-315267 A | 12/1998 |
| JP | 2013-219195 A | 10/2013 |
| JP | 2013219195 A | 10/2013 |
| JP | 2015-18855 A | 1/2015 |
| WO | 03/062253 A1 | 7/2003 |
| WO | 2011/079799 A1 | 7/2011 |

OTHER PUBLICATIONS

International Preliminary Report on Patentability (Form PCT/IB/373) issued in counterpart International Application No. PCT/JP2018/018067 dated Nov. 12, 2019 with Forms PCT/ISA/237, with English translation (8 pages).

Toplosky et al., "Thermal and Mechanical Properties of Poly-Dicyclopentadiene (DCPD) at Cryogenic Temperatures", CP824, Advances in Cryogenic Engineering: Transactions of the International Cryogenic Materials Conference—ICMC, vol. 52, edited by U. Balachandran, pp. 219-224, cited in Specification (6 pages).

International Search Report dated Jul. 31, 2018, issued in counterpart International Application No. PCT/JP2018/018067 (1 page).

\* cited by examiner

SUPERCONDUCTING COIL DEVICE AND METHOD FOR PRODUCING SAME

TECHNICAL FIELD

The present invention relates to a superconducting coil device, and a method for producing the same.

BACKGROUND ART

A superconducting coil device having a superconducting coil housed in a coil case is used as a superconducting magnet that generates a high magnetic field.

In this regard, in a superconducting coil, a superconducting wire is impregnated with a resin. As the impregnation for a superconducting wire with a resin, conventionally, impregnation with an epoxy has been performed, however, recently, impregnation with a norbornene resin in place of the epoxy resin has been tried. In JP 2015-18855 A (Patent Literature 1), a technique in which in a superconducting coil impregnated with a norbornene-based resin, the impregnation with a norbornene-based resin to a coil is performed by winding a rare earth-based superconducting material into a coil while applying a polymerizable composition containing a norbornene-based monomer and a metathesis polymerization catalyst, and then by polymerizing and curing the composition has been disclosed.

Such a norbornene-based resin is formed by metathesis-polymerizing a polymerizable composition containing a norbornene-based monomer and a metathesis polymerization catalyst. In JP H08-267495 A (Patent Literature 2), a technique in which in a method for forming a crosslinked polymer molded product, a monomer solution prepared of a metathesis polymerizable cyclic olefin containing a catalyst component of a metathesis polymerization catalyst system, or the like is polymerized and subjected to crosslinking reaction has been disclosed.

Further, in Non Patent Literature 1, it has been suggested that poly-dicyclopentadiene (poly-DCPD) has favorable toughness in many applications at a low temperature. Toughness is an important property in the applications at a low temperature.

CITATION LIST

Patent Literature

Patent Literature 1: JP 2015-18855 A
Patent Literature 2: JP H08-267495 A

Non Patent Literature

Non Patent Literature 1: CP824, Advances in Cryogenic Engineering: Transactions of the International Cryogenic Materials Conference-ICMC, Vol. 52, edited by U. Balachandran, pp. 219-224

SUMMARY OF INVENTION

Technical Problem

In a superconducting coil device having a superconducting coil housed in a coil case, in a case where the superconducting coil is not firmly fixed to the coil case, when vibration is applied to the superconducting coil device, positional displacement of the superconducting coil to the coil case is generated, and heat may be generated due to friction. In view of this, it is required to fill a gap between an inner wall of a coil case and a superconducting coil with a resin, and to firmly fix the superconducting coil to the coil case with the filled resin.

However, in a case where the resin is made of an epoxy, there have been the following problems. First, during the production, since a polymerizable composition that is a raw material for the resin has a high viscosity, it has been difficult to inject the polymerizable composition into a gap between an inner wall of a coil case and a superconducting coil, and it has been difficult to firmly fix the superconducting coil to the coil case. In addition, during the use, the toughness of the resin at a low temperature is low, voids or cracks may be generated in a resin part when a superconducting coil device is cooled or operated, and therefore, it has been difficult to firmly fix the superconducting coil to the coil case.

The present invention has been made to solve the problems of conventional techniques as described above, and an object of the present invention is to provide a superconducting coil device in which a raw material for a resin part can be easily injected into a gap between an inner wall of a coil case and a superconducting coil during production, and further, generation of voids or cracks in the resin part can be prevented or suppressed during use in the superconducting coil device in which the gap between the inner wall of the coil case and the superconducting coil is filled with the resin part.

Solution to Problem

Among the aspects of the invention disclosed in the present application, the outline of typical ones will be briefly described as follows.

A superconducting coil device as one aspect of the present invention includes: a housing part housing a superconducting coil; the superconducting coil housed in the housing part; and a resin part filled in a gap between an inner wall of the housing part and the superconducting coil. The resin part is formed of a polymer obtained by polymerizing a polymerizable composition containing a first monomer having a norbornene ring structure.

Further, as another aspect, the polymerizable composition may further contain a second monomer having a norbornene ring structure and being of a kind different from the kind of the first monomer, the first monomer may be made of dicyclopentadiene, and the second monomer may be made of one or more kinds of compounds represented by the following general formula (1):

[Chemical formula 1]

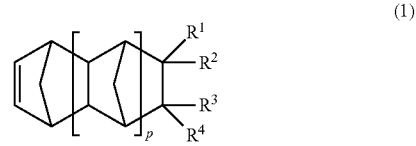

(In the general formula (1), each of $R^1$, $R^2$, $R^3$ and $R^4$ independently represents a hydrogen atom or a hydrocarbon group having from 1 to 20 carbon atoms, $R^1$ and $R^2$ or $R^3$ and $R^4$ may together form an alkylidene group, $R^1$ and/or $R^2$ and $R^3$ and/or $R^4$ may form a ring structure, and p represents 0, 1 or 2), and may be made of one or more kinds selected from the group consisting of norbornene, tetracyclododecene, 5-ethylidene norbornene, 8-ethylidene tetracyclododecene, and tricyclopentadiene.

Further, as another aspect, a content of the second monomers in the polymerizable composition may be 4 parts by mass or more when the total content of the first monomers in the polymerizable composition and the second monomers in the polymerizable composition is taken as 100 parts by mass.

Further, as another aspect, the superconducting coil may include a plurality of pancake coils, each being prepared by winding a superconducting wire in a spiral form around a winding axis along a first direction, the pancake coils being disposed one on another in layers in the first direction in the housing part and connected in series.

Further, as another aspect, the housing part may include: a container body part having a recessed part; and a lid part that closes the recessed part, the container body part may have a main surface intersecting with the first direction, the recessed part may be formed on the main surface, and the plurality of pancake coils may be disposed one on another in layers in the recessed part.

Further, as another aspect, the housing part may be formed of an aluminum alloy, stainless steel, or glass fiber reinforced plastic (GFRP).

A method for producing a superconducting coil device as one aspect of the present invention includes the steps of: (a) housing a superconducting coil in a housing part that houses the superconducting coil; (b) injecting a polymerizable composition into the housing part after the step (a); and (c) polymerizing the polymerizable composition after the step (b), and filling a gap between an inner wall of the housing part and the superconducting coil with a resin part formed of a polymer of the polymerizable composition. The polymerizable composition contains a first monomer having a norbornene ring structure.

Further, as another aspect, the polymerizable composition may further contain a second monomer having a norbornene ring structure and being of a kind different from the kind of the first monomer. The first monomer may be made of dicyclopentadiene, and the second monomer may be made of one or more kinds of compounds represented by the above-described general formula (1), and may be made of one or more kinds selected from the group consisting of norbornene, tetracyclododecene, 5-ethylidene norbornene, 8-ethylidene tetracyclododecene, and tricyclopentadiene.

Further, as another aspect, a content of the second monomers in the polymerizable composition may be 4 parts by mass or more when the total content of the first monomers in the polymerizable composition and the second monomers in the polymerizable composition is taken as 100 parts by mass.

Further, as another aspect, in the step (b), the polymerizable composition having a viscosity of 100 mPa·s or less at 25° C. may be injected, and in the step (c), the polymerizable composition may be polymerized at a temperature of 250° C. or less.

Further, as another aspect, the step (a) may include the step of (a1) housing a plurality of pancake coils each being prepared by winding a superconducting wire in a spiral form in the housing part. In the step (a1), a pancake coil just housed may be electrically connected to the last pancake coil housed immediately before the just housed pancake coil is housed, and then the following pancake coil may be housed. In the step (a), by performing the step (a1) in a state that a winding axis of each of the plurality of pancake coils is along a first direction, a superconducting coil containing the plurality of pancake coils, each being prepared by winding a superconducting wire in a spiral form around the winding axis along the first direction, the pancake coils being disposed one on another in layers in the first direction and connected in series may be housed.

Further, as another aspect, the housing part may include: a container body part having a recessed part; and a lid part that closes the recessed part, the container body part may have a main surface intersecting with the first direction, the recessed part may be formed on the main surface, and in the step (a1), the plurality of pancake coils may be housed in the recessed part.

Further, as another aspect, the container body part may include: a first opening part formed on the main surface, arranged closer to a first side than the recessed part in a second direction intersecting with the first direction, and communicated with the recessed part; and a second opening part formed on the main surface, arranged closer to the opposite side of the first side than the recessed part in the second direction, and communicated with the recessed part. The step (b) may include the steps of: (b1) closing the recessed part with the lid part; (b2) after the step (b1), starting injection of the polymerizable composition from the first opening part into the recessed part in a state that the main surface is tilted with respect to a horizontal plane so that a position of the first opening part is higher than that of the second opening part; and (b3) after the step (b2), injecting the polymerizable composition from the first opening part into the recessed part while decreasing a tilting angle of the main surface with respect to the horizontal plane.

Further, as another aspect, the housing part may be formed of an aluminum alloy, stainless steel, or glass fiber reinforced plastic (GFRP).

Advantageous Effects of Invention

By applying one aspect of the present invention, in the superconducting coil device in which a gap between an inner wall of a coil case and a superconducting coil is filled with a resin part, a raw material for the resin part can be easily injected into the gap between the inner wall of the coil case and the superconducting coil during the production, and further, generation of voids or cracks in the resin part can be prevented or suppressed during the use.

DESCRIPTION OF EMBODIMENTS

Figure 1:
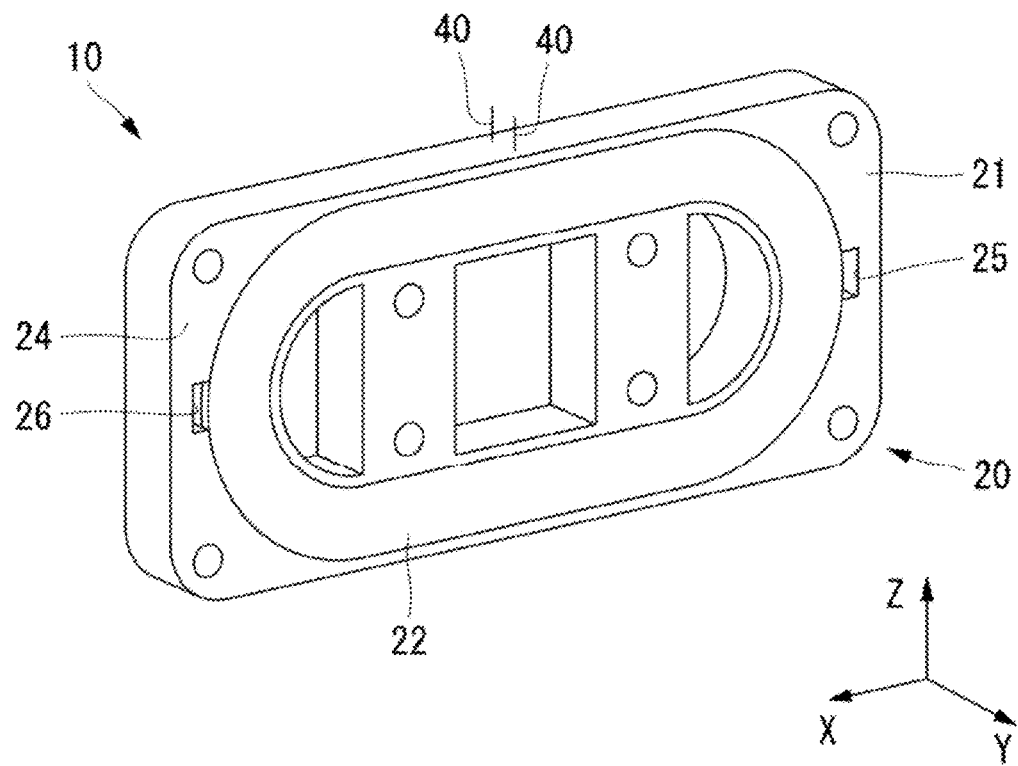
FIG. 1 is a perspective view of a superconducting coil device according to an embodiment.

Hereinafter, each of the embodiments of the present invention will be described while making reference to drawings.

In this regard, the disclosure is only an example, appropriately changed ones that can be easily conceived by those skilled in the art while keeping the gist of the invention are naturally included in the scope of the present invention. In addition, in drawings, in order to describe more clearly the drawings, there may be a case where the width, thickness, shape, and the like of each part are expressed schematically as compared with those of the embodiment, the case is merely an example, and does not limit the interpretation of the present invention.

Further, in the present specification and each of the drawings, elements similar to those described previously with respect to the drawings described already may be given the same reference numerals and detailed descriptions thereof may be omitted as appropriate.

In addition, in the drawings used in an embodiment, hatching (shading) added to distinguish a structure may be omitted depending on the drawing.

Further, in the following embodiments, in a case where a range is shown as from A to B, the range means A or more and B or less are shown unless otherwise particularly specified.

EMBODIMENT

<Superconducting Coil Device>

Figure 2:
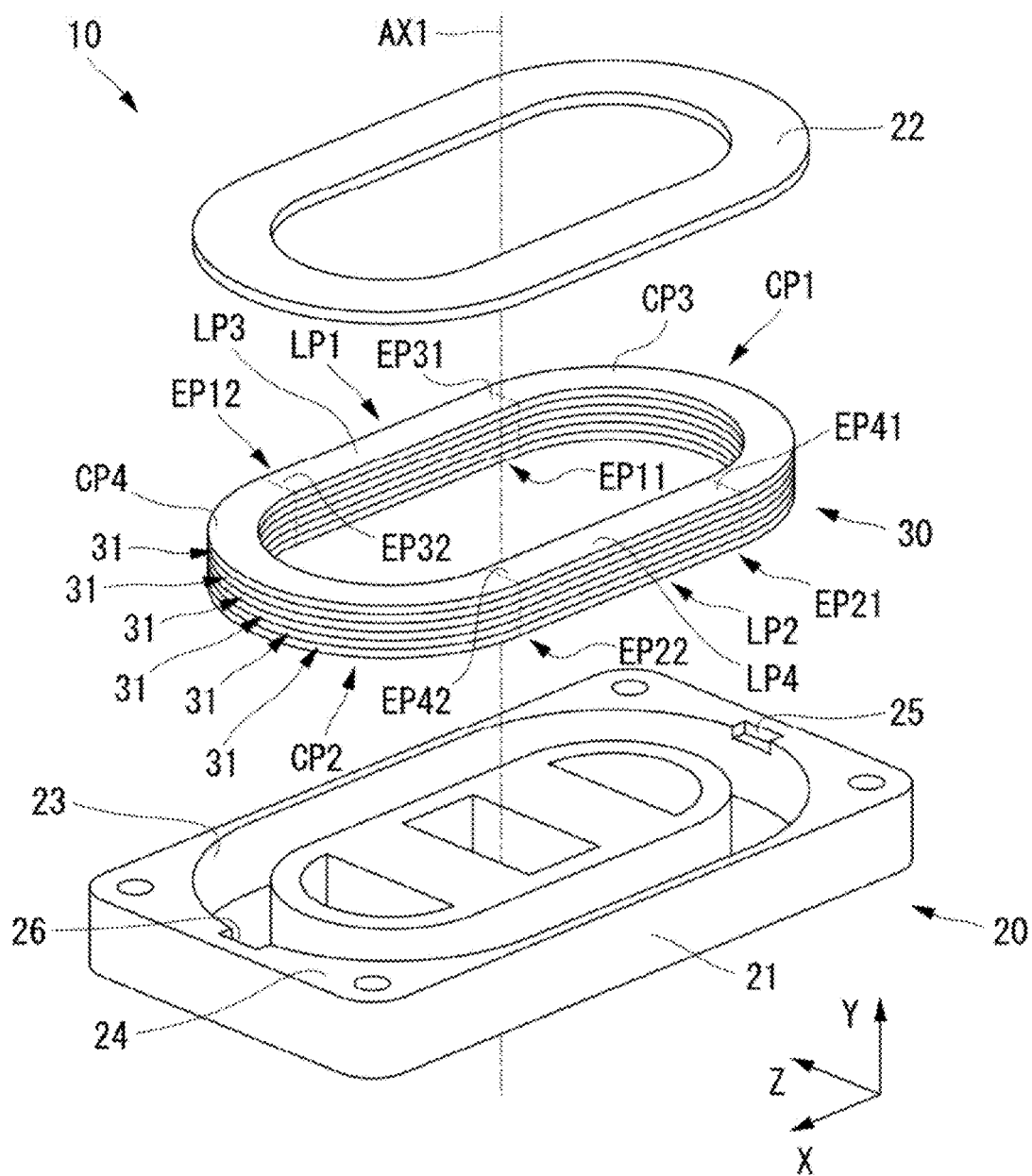
FIG. 2 is an exploded perspective view of a superconducting coil device according to an embodiment.
Figure 3:
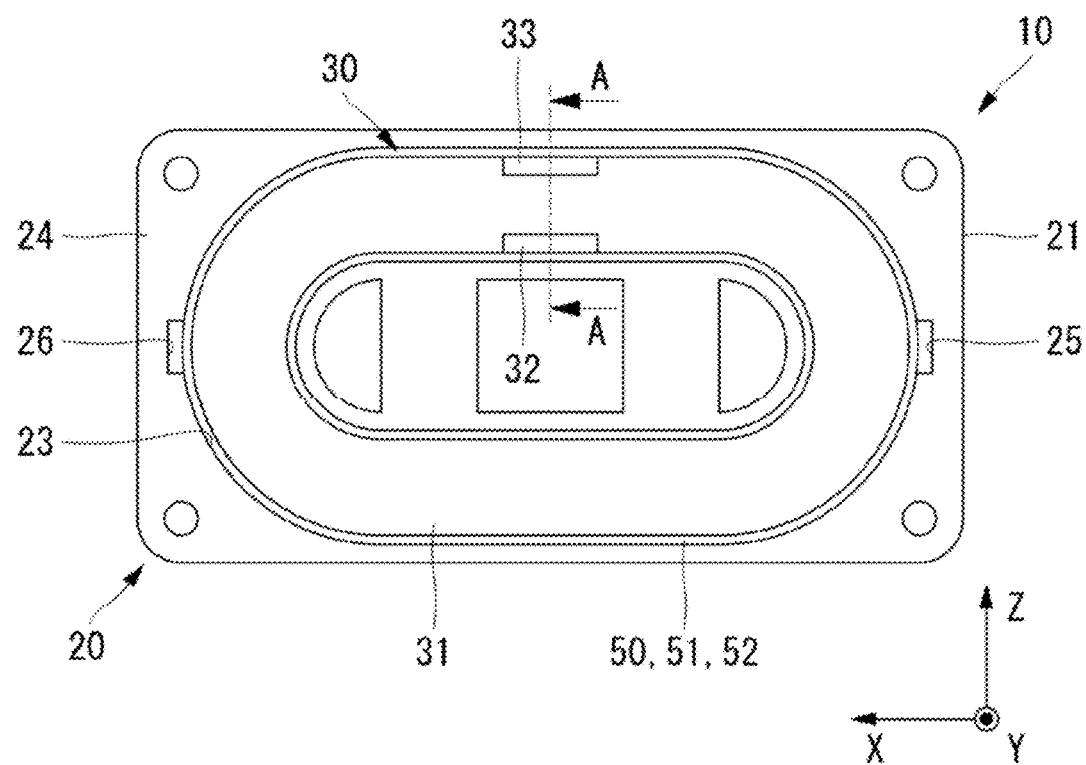
FIG. 3 is a front view of a superconducting coil device according to an embodiment.
Figure 4:
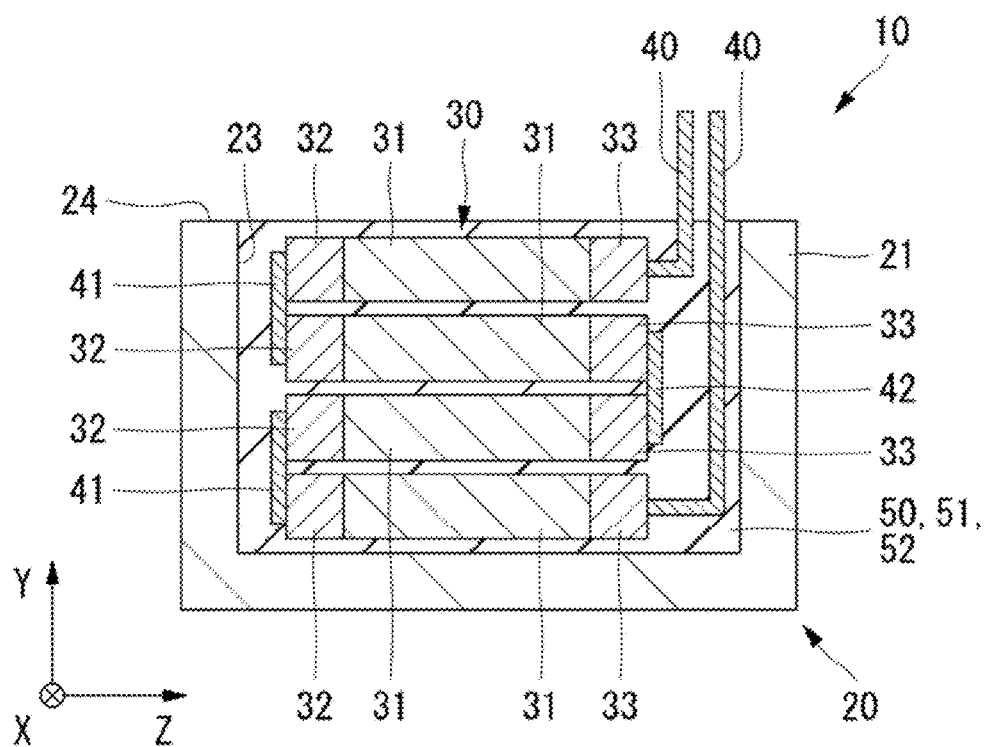
FIG. 4 is a cross-sectional view of the main part of a superconducting coil device according to an embodiment.
Figure 5:
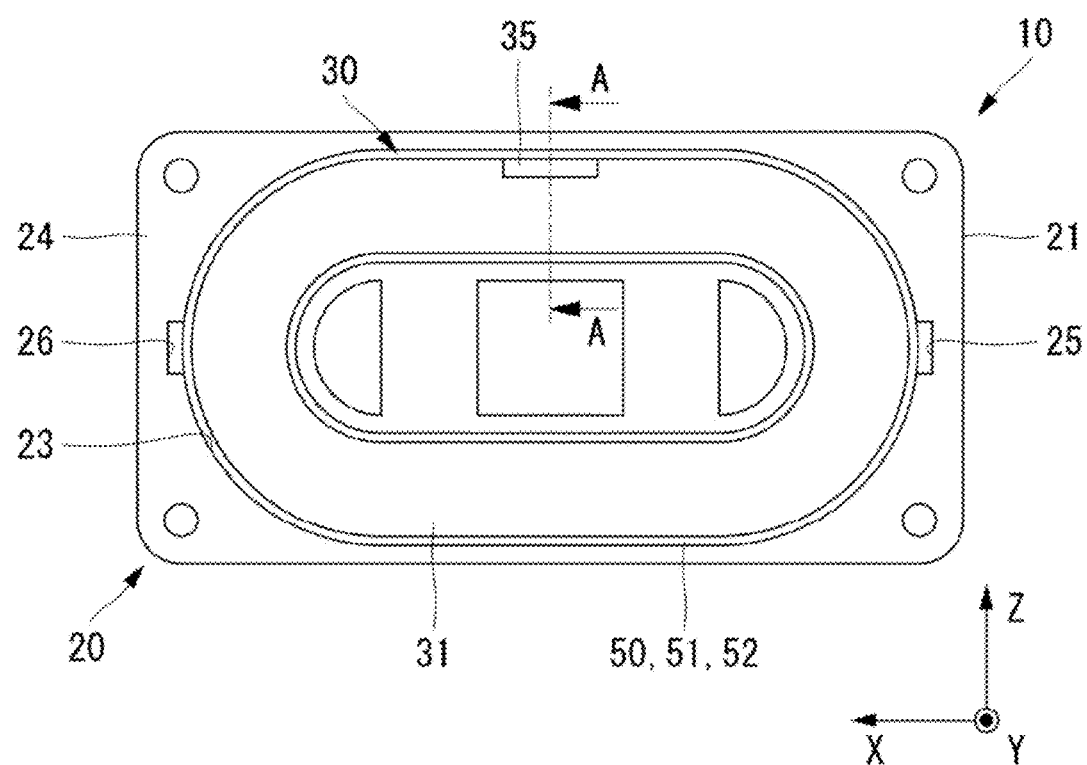
FIG. 5 is a front view of another example of a superconducting coil device according to an embodiment.
Figure 6:
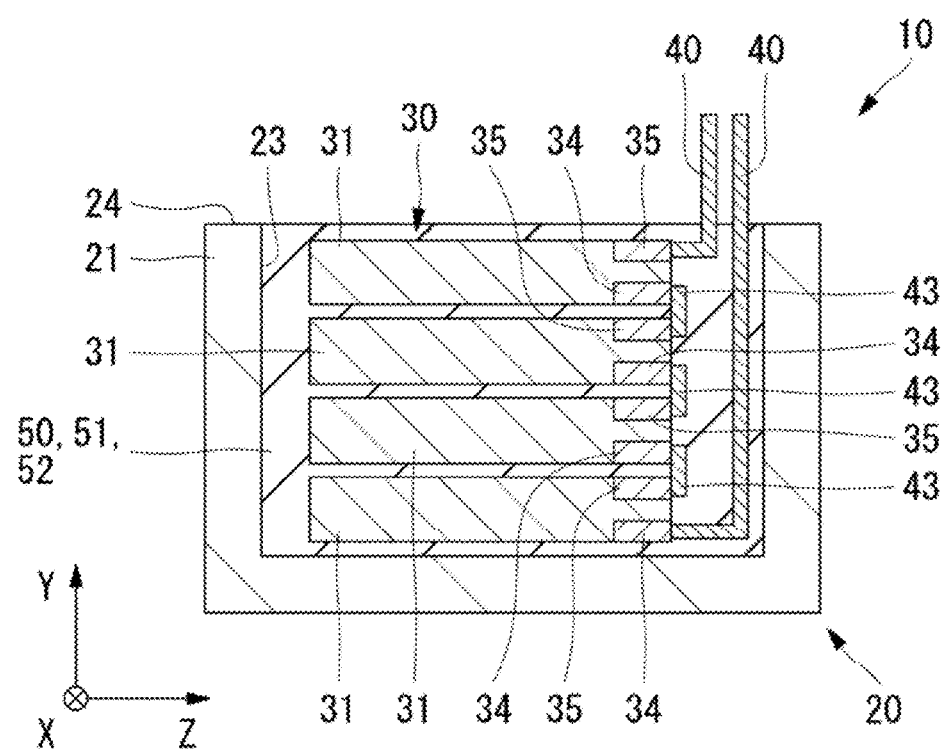
FIG. 6 is a cross-sectional view of the main part of another example of a superconducting coil device according to an embodiment.

Firstly, a superconducting coil device of an embodiment, which is one embodiment of the present invention, will be described. FIG. 1 is a perspective view of a superconducting coil device according to the embodiment. FIG. 2 is an exploded perspective view of a superconducting coil device according to the embodiment. FIG. 3 is a front view of a superconducting coil device according to the embodiment. FIG. 4 is a cross-sectional view of the main part of a superconducting coil device according to the embodiment. FIG. 5 is a front view of another example of a superconducting coil device according to the embodiment. FIG. 6 is a cross-sectional view of the main part of another example of a superconducting coil device according to the embodiment. In this regard, FIGS. 3 to 6 each show a state that a lid part of the coil case is removed, FIG. 4 is a cross-sectional view taken along the line A-A in FIG. 3, and FIG. 6 is a cross-sectional view taken along the line A-A in FIG. 5. Further, FIG. 2 shows a state before a resin part is formed for the sake of easy understanding.

As shown in FIGS. 1 to 4, a superconducting coil device 10 in the present embodiment includes a coil case 20, a superconducting coil 30, and two current leads 40. The coil case 20 is a housing part for housing the superconducting coil 30. The superconducting coil 30 is housed in the coil case 20, that is, in the housing part. The two current leads 40 are connected to both ends of the superconducting coil 30, respectively. Each of the two current leads 40 is drawn out of the superconducting coil device 10.

Further, the superconducting coil device 10 in the present embodiment has a resin part 50. The resin part 50 is formed of a polymer 51 filled in a gap between the superconducting coil 30 housed in a coil case 20 and the inner wall of the coil case 20. The polymer 51 has a norbornene ring structure. That is, the polymer 51 is made of a polymer obtained by polymerizing monomers each having a norbornene ring structure, that is, the so-called norbornene-based resin. In this regard, the superconducting coil 30 may be impregnated with at least a part of the polymer 51.

A case where a superconducting coil device 10 having a superconducting coil 30 is used as a superconducting magnet that generates a high magnetic field is considered. In such a case, the electromagnetic force applied to the superconducting coil 30 by the self-magnetic field generated by the superconducting coil 30 itself may be larger than the strength of the superconducting coil 30 itself alone, and therefore, it is required to receive the electromagnetic force in the coil case 20 that houses the superconducting coil 30.

Further, a case where a superconducting coil device 10 is used in the application in which vibration is applied, for example, in a linear motor in a magnetic levitating transportation system, or the like is considered. In such a case, in a case where a superconducting coil 30 housed in a coil case 20 is not firmly fixed to the coil case 20, when vibration is applied to the superconducting coil device 10, positional displacement of the superconducting coil 30 to the coil case 20 is generated, and heat may be generated due to friction. Further, as a result, the so-called quench may be generated, in which the superconducting coil 30 is not in a superconducting state.

In view of this, it is required to fill a gap between the inner wall of the coil case 20 and the superconducting coil 30 with a polymer 51, and to firmly fix the superconducting coil 30 to the coil case 20 with the filled polymer 51.

In this regard, a case where an epoxy resin is used as the polymer 51 is considered. Further, a case where after housing a superconducting coil 30 in a coil case 20, a polymerizable composition 52 that is a raw material for an epoxy resin is injected into a gap between the inner wall of the coil case 20 and the superconducting coil 30, and then, for example, heat treatment is performed to polymerize and cure the injected polymerizable composition 52, that is, the injected polymerizable composition 52 is polymerized and cured to form a polymer 51 is considered.

In such a case, during the production, since the polymerizable composition 52 that is a raw material for the polymer 51 made of an epoxy has a high viscosity, it is difficult to inject the polymerizable composition 52 into a narrow gap in a part between the inner wall of the coil case 20 and the superconducting coil 30, and it has been difficult to eliminate voids, that is, air gaps, in a part between the inner wall of the coil case 20 and the superconducting coil 30.

If a void is left in a part between the inner wall of the coil case 20 and the superconducting coil 30, the superconducting coil 30 housed in the coil case 20 is not firmly fixed to the coil case 20, and when vibration is applied to the superconducting coil device 10, positional displacement of the superconducting coil 30 to the coil case 20 is generated, heat is generated due to friction, and quench may be generated.

Further, in a case of using a polymer 51 made of an epoxy, the polymer 51 has a wide range of toughness at a low temperature, and it is difficult to adjust the polymer 51 so that the toughness does not become low. Therefore, during the use, the toughness of the polymer 51 at a low temperature is lowered, and for example, stress is applied to a superconducting coil 30 due to shrinkage of the polymer 51 when the superconducting coil device 10 is cooled, or vibration is applied to the superconducting coil device 10 when the superconducting coil device 10 is operated as a superconducting magnet, and as a result, voids or cracks may be generated in a resin part 50 formed of the polymer 51.

When voids or cracks are generated in a resin part 50 formed of the polymer 51, the superconducting coil 30 housed in a coil case 20 is not firmly fixed to the coil case 20, and when vibration is applied to the superconducting coil device 10, positional displacement of the superconducting coil 30 to the coil case 20 is generated, heat is generated due to friction, and quench may be generated.

On the other hand, in the present embodiment, as the polymer 51, a polymer having a norbornene ring structure (norbornene-based resin) is used. A polymerizable composition 52 that is a raw material for the polymer 51 having a norbornene ring structure contains a cyclic hydrocarbon having a norbornene ring structure. Further, the viscosity at 25° C. of the polymerizable composition 52 that is a raw material for the polymer 51 having a norbornene ring structure is, for example, 100 mPa·s or less, and is extremely lower than that of the polymerizable composition 52 that is a raw material for the polymer 51 made of an epoxy.

Accordingly, during the production, even in a case where a superconducting coil 30 is housed in a coil case 20, and then a polymerizable composition 52 is injected into a gap between an inner wall of the coil case 20 and the superconducting coil 30, the polymerizable composition 52 can be easily injected even into a narrow gap in a part between the inner wall of the coil case 20 and the superconducting coil 30, and therefore, voids, that is, air gaps, in a part between the inner wall of the coil case 20 and the superconducting coil 30 can be easily eliminated.

Further, in a case where a polymer having a norbornene ring structure is used as the polymer 51, the polymer can be easily adjusted so that the toughness of the polymer 51 at a low temperature becomes higher than that of a resin composition made of an epoxy.

Accordingly, during the use, even in a case where for example, stress is applied to the superconducting coil 30 due to shrinkage of the polymer 51 when the superconducting coil device 10 is cooled, or even in a case where vibration is applied to the superconducting coil device 10 when the superconducting coil device 10 is operated as a superconducting magnet, generation of voids or cracks in a resin part 50 formed of the polymer 51 can be prevented or suppressed, that is, breaking of the resin part 50 can be prevented or suppressed. Therefore, since the superconducting coil 30 housed in the coil case 20 is more firmly fixed to the coil case 20, generation of heat due to friction as a result of generating positional displacement of the superconducting coil 30 to the coil case 20 can be prevented or suppressed, and further generation of quench can be prevented or suppressed.

That is, according to the superconducting coil device according to the present embodiment, during the production, a raw material for a polymer 51 can be easily injected into a gap between the inner wall of the coil case 20 and the superconducting coil 30, and further, during the use, generation of voids or cracks in a resin part 50 formed of the polymer 51 can be prevented or suppressed. In addition, details of the polymer 51 having a norbornene ring structure will be described later.

Although the structure of the coil case 20 is not particularly limited, the coil case 20 suitably includes a container body part 21 and a lid part 22. The container body part 21 has a recessed part 23. The container body part 21 has a main surface 24, the recessed part 23 is formed on the main surface 24, and the lid part 22 closes the recessed part 23.

Three directions intersecting with one another, and suitably perpendicular to one another are taken as an X-axis direction, a Y-axis direction, and a Z-axis direction, respectively. Further, the container body part 21 has a main surface 24, the main surface 24 is taken to be along the X-axis direction and the Z-axis direction and to intersect with the Y-axis direction. For example, in a case where the superconducting coil device 10 in the present embodiment is used as an on-vehicle coil to be arranged on a vehicle in a magnetic levitating transportation system, the X-axis direction can be taken as the traveling direction of the vehicle in the magnetic levitating transportation system, the Y-axis direction can be taken as the width direction of the vehicle in the magnetic levitating transportation system, and the Z-axis direction can be taken as the vertical direction of the vehicle in the magnetic levitating transportation system. On the other hand, in the production process of the superconducting coil device 10, the Y-axis direction can be taken as the vertical direction, and the main surface 24 along the X-axis direction and the Z-axis direction can be taken as the horizontal plane.

The coil case 20 has a container body part 21 and a lid part 22, the main surface 24 of the container body part 21 intersects with the Y-axis direction, and a recessed part 23 is formed on the main surface 24, as a result of which after housing a superconducting coil 30 in the recessed part 23, a polymerizable composition 52 can be easily injected into the recessed part 23, and a gap between an inner wall of the recessed part 23 and the superconducting coil 30 can be easily filled with a resin part 50 formed of a polymer 51. Further, hereinafter, a case where the coil case 20 has the recessed part 23 will be described as an example.

The material for the coil case 20 is not particularly limited, and suitably, each of the container body part 21 and lid part 22 included in the coil case 20 is formed of an aluminum alloy, stainless steel, or glass fiber reinforced plastic (GFRP). In a case where each of the container body part 21 and lid part 22 is formed of an aluminum alloy, the thermal conductivity and the lightweight property are excellent. In a case where each of the container body part 21 and lid part 22 is formed of stainless steel, the thermal conductivity and the mechanical strength are excellent. In a case where each of the container body part 21 and lid part 22 is formed of GFRP, the mechanical strength is excellent. In this regard, the respective materials for the container body part 21 and lid part 22 may be different from each other.

Although the shape of the superconducting coil 30 is not particularly limited, and as shown in FIG. 2, suitably, the superconducting coil 30 is formed by winding a superconducting wire in a racetrack form around an axis AX1 as a winding axis along the Y-axis direction. The superconducting coil 30 includes a straight line part LP1 and a straight line part LP2, and a curve part CP1 and a curve part CP2. The straight line part LP1 and the straight line part LP2 respectively extend along the X-axis direction and are arranged opposite to each other with the axis AX1 interposed therebetween. The curve part CP1 connects an end part EP11 on a first side (the opposite side of the arrow direction of the X-axis direction in FIG. 2) in the X-axis direction of the straight line part LP1 to an end part EP21 on the first side in the X-axis direction of the straight line part LP2. The curve part CP2 connects an end part EP12 on the opposite side of the first side (the same side of the arrow direction of the X-axis direction in FIG. 2) in the X-axis direction of the straight line part LP1 to an end part EP22 on the opposite side of the first side in the X-axis direction of the straight line part LP2.

In this way, for example, in a case where the superconducting coil device 10 is used as an on-vehicle coil in a magnetic levitating transportation system, in a part sandwiched between the straight line part LP1 and the straight line part LP2, the uniformity of the strength of the magnetic field generated by the superconducting coil 30 in the traveling direction of a vehicle can be improved.

Further, in a case where the superconducting coil 30 is formed by winding a superconducting wire in a racetrack form, the surface area of the superconducting coil 30 may become larger than that in a case where the superconducting coil 30 is formed by winding a superconducting wire in a circle form. In addition, as described above, the polymerizable composition 52 that is a raw material for a polymer 51 made of an epoxy has a high viscosity. As a result, in a case where an epoxy is used as the polymer 51, the polymerizable composition 52 that is a raw material for the epoxy is stored in the coil case 20, and then the superconducting coil 30 has to be immersed in the stored polymerizable composition 52 and housed in the coil case 20, and therefore it is difficult to completely cover the surface of the superconducting coil 30 with the polymerizable composition 52. Further, in a case where the superconducting coil 30 is housed in the coil case 20, and then the polymerizable composition 52 that is a raw material for the epoxy is injected in the coil case 20, it is more difficult to completely cover the surface of the superconducting coil 30 with the polymerizable composition 52.

On the other hand, the polymerizable composition 52 that is a raw material for the polymer 51 having a norbornene ring structure has a viscosity lower than that of the polymerizable composition 52 that is a raw material for the polymer 51 made of an epoxy. Therefore, as compared with the case where the superconducting coil 30 is formed by winding a superconducting wire in a circle form, in a case where the superconducting coil 30 is formed by winding a superconducting wire in a racetrack form, a raw material for the polymer 51 can be easily injected into a gap between the inner wall of the coil case 20 and the superconducting coil 30 as described above, and the effect capable of preventing or suppressing the generation of voids or cracks in a resin part 50 formed of the polymer 51 becomes more enhanced.

Suitably, the superconducting coil 30 includes a plurality of pancake coils 31. The plurality of pancake coils 31 are each formed by winding a superconducting wire in a spiral form around an axis AX1 as a winding axis along the Y-axis direction, disposed one on another in layers in a direction along the Y-axis direction, that is, the axis AX1 in the coil case 20, that is, in the recessed part 23, and further, connected in series. Further, as the superconducting wire, for example, a tape-shaped superconducting wire made of a high-temperature superconducting material such as a rare-earth barium copper oxide ($REBa_2Cu_3O_7$: REBCO) including an yttrium barium copper oxide ($YBa_2Cu_3O_7$: YBCO), a gadolinium barium copper oxide ($GdBa_2Cu_3O_7$: GdBCO) or the like can be used.

In such a case, by disposing a plurality of pancake coils 31, each of which is formed by winding a tape-shaped superconducting wire made of a high-temperature superconducting material in a spiral form, one on another in layers, a superconducting coil 30 can be formed. Therefore, for example, as compared with the case of using a superconducting coil made of a low-temperature superconducting material such as niobium titanium (NbTi), the superconducting coil 30 can be operated as a superconducting magnet at a high temperature, and can reduce the power consumption required for operating a refrigerator or the like during the operation.

Specifically, the plurality of pancake coils 31 are each wound in a racetrack form around an axis AX1, and include a straight line part LP3 and a straight line part LP4, and a curve part CP3 and a curve part CP4. The straight line part LP3 and the straight line part LP4 respectively extend along the X-axis direction and are arranged opposite to each other with the axis AX1 interposed therebetween. The curve part CP3 connects an end part EP31 on a first side (the opposite side of the arrow direction of the X-axis direction in FIG. 2) in the X-axis direction of the straight line part LP3 to an end part EP41 on the first side in the X-axis direction of the straight line part LP4. The curve part CP4 connects an end part EP32 on the opposite side of the first side (the same side of the arrow direction of the X-axis direction in FIG. 2) in the X-axis direction of the straight line part LP3 to an end part EP42 on the opposite side of the first side in the X-axis direction of the straight line part LP4.

A plurality of straight line parts LP3 possessed respectively by a plurality of pancake coils 31 are disposed one on another in layers in the Y-axis direction, and the plurality of straight line parts LP3 disposed one on another in layers form a straight line part LP1 of a superconducting coil 30. A plurality of straight line parts LP4 possessed respectively by the plurality of pancake coils 31 are disposed one on another in layers in the Y-axis direction, and the plurality of straight line parts LP4 disposed one on another in layers form a straight line part LP2 of the superconducting coil 30. A plurality of curve parts CP3 possessed respectively by the plurality of pancake coils 31 are disposed one on another in layers in the Y-axis direction, and the plurality of curve parts CP3 disposed one on another in layers form a curve part CP1 of the superconducting coil 30. A plurality of curve parts CP4 possessed respectively by the plurality of pancake coils 31 are disposed one on another in layers in the Y-axis direction, and the plurality of curve parts CP4 disposed one on another in layers form a curve part CP2 of the superconducting coil 30.

As shown in FIGS. 3 and 4, a case where one pancake coil 31 is formed of one layer of pancake coil, that is, a single pancake coil, and includes an inner electrode 32 and an outer electrode 33 is considered. Further, as shown in FIGS. 3 and 4, a case where four pancake coils 31 of a first layer, a second layer, a third layer, and a fourth layer are disposed one on another in layers in order from the bottom part side of a recessed part 23 toward a main surface 24 side in the recessed part 23 formed in a container body part 21 is considered. In this regard, in FIG. 4, for the sake of easy understanding, a case where four pancake coils 31 are disposed one on another in layers is mentioned as an example, however, the number of layers of pancake coils 31 is not limited, and any number of a plurality of pancake coils 31 can be disposed one on another in layers.

In such a case, as shown in FIG. 4, two current leads 40 are electrically connected to both ends of a superconducting coil 30, respectively, one current lead 40 of the two current leads 40 is electrically connected to an outer electrode 33 of the first layer of pancake coil 31, and the other current lead 40 of the two current leads 40 is electrically connected to an outer electrode 33 of the fourth layer of pancake coil 31. An inner electrode 32 of the first layer of pancake coil 31 is electrically connected to an inner electrode 32 of the second layer of pancake coil 31 with a connection member 41 therebetween. An outer electrode 33 of the second layer of pancake coil 31 is electrically connected to an outer electrode 33 of the third layer of pancake coil 31 with a connection member 42 therebetween. An inner electrode 32 of the third layer of pancake coil 31 is electrically connected to an inner electrode 32 of the fourth layer of pancake coil 31 with a connection member 41 therebetween. Further, in a similar manner, one or more pancake coils 31 can be disposed one on another in layers.

Alternatively, as shown in FIGS. 5 and 6, a case where one pancake coil 31 is formed of two layers of upper and lower layers of pancake coils, that is, a double pancake coil, and includes two outer electrodes 34 and 35 of the upper and lower layers is considered. Further, as shown in FIGS. 5 and 6, a case where four pancake coils 31 of a first layer, a second layer, a third layer, and a fourth layer are disposed one on another in layers in order from the bottom part side of a recessed part 23 toward a main surface 24 side in the recessed part 23 formed on the main surface 24 of a container body part 21 is considered. In this regard, in FIG. 6, for the sake of easy understanding, a case where four pancake coils 31 are disposed one on another in layers is mentioned as an example, however, the number of layers of pancake coils 31 is not limited, and any number of a plurality of pancake coils 31 can be disposed one on another in layers. In addition, in FIG. 6, a second side in the Y-axis direction (the same side of the arrow direction of the Y-axis direction in FIG. 6) is referred to as the upper side, and the opposite side of the second side in the Y-axis direction (the opposite side of the arrow direction of the Y-axis direction in FIG. 6) is referred to as the lower side.

In such a case, as shown in FIG. 6, two current leads 40 are electrically connected to both ends of a superconducting coil 30, respectively, one current lead 40 of the two current leads 40 is electrically connected to an outer electrode 34 of the lower layer in the first layer of pancake coil 31, and the other current lead 40 of the two current leads 40 is electrically connected to an outer electrode 35 of the upper layer in the fourth layer of pancake coil 31. An outer electrode 35 of the upper layer in the first layer of pancake coil 31 is electrically connected to an outer electrode 34 of the lower layer in the second layer of pancake coil 31 with a connection member 43 therebetween. An outer electrode 35 of the upper layer in the second layer of pancake coil 31 is electrically connected to an outer electrode 34 of the lower layer in the third layer of pancake coil 31 with a connection member 43 therebetween. An outer electrode 35 of the upper layer in the third layer of pancake coil 31 is electrically connected to an outer electrode 34 of the lower layer in the fourth layer of pancake coil 31 with a connection member 43 therebetween. Further, in a similar manner, one or more pancake coils 31 can be disposed one on another in layers.

In this regard, in the present embodiment, a case where a superconducting coil device 10 has a superconducting coil 30 including a plurality of pancake coils 31 disposed one on another in layers has been described as an example. However, the superconducting coil device 10 may have a superconducting coil 30 formed by winding a superconducting wire integrally or continuously.

<Polymer and Polymerizable Composition>

Next, in the superconducting coil device according to the present embodiment, the suitable compositions of a polymer filled in a gap between an inner wall of a coil case and a superconducting coil, and a polymerizable composition as a raw material for forming the polymer, will be described.

As described above, in the superconducting coil device 10 of the present embodiment, a polymer 51 filled in a gap between the inner wall of a recessed part 23 in a coil case 20 and the superconducting coil 30 has a norbornene ring structure. That is, the polymer 51 filled in a gap between an inner wall of a recessed part 23 in a coil case 20 and a superconducting coil 30 is made of the so-called norbornene-based resin.

The norbornene-based resin in the specification of the present application means a polymer obtained by polymerizing monomers of one kind each having a norbornene ring structure, or a copolymer obtained by polymerizing a plurality of kinds of monomers each having a norbornene ring structure. In other words, the norbornene-based resin in the specification of the present application means a polymer obtained by polymerizing norbornene-based monomers of one kind, or a copolymer obtained by polymerizing a plurality of kinds of norbornene-based monomers. Accordingly, the polymer 51 filled in a gap between the inner wall of the recessed part 23 in the coil case 20 and the superconducting coil 30 may be a norbornene-based resin, and is not particularly limited.

Further, in the present specification, in order to distinguish the two monomers, for convenience, the monomers are described as first monomers and second monomers, and both of which are norbornene-based monomers.

However, from the viewpoint of making the superconducting coil device 10 of the present embodiment more excellent in the quality stability, as the polymer 51 made of a norbornene-based resin, it is preferred to use a polymer obtained by polymerizing and curing a polymerizable composition 52 containing norbornene-based monomers and a metathesis polymerization catalyst by bulk polymerization. Further, as the polymerizable composition 52, any polymerizable composition may be used as long as it contains norbornene-based monomers and a metathesis polymerization catalyst, and the polymerizable composition 52 is not particularly limited. However, in view of having a suppressed viscosity and of being easily filled in a gap between an inner wall of a recessed part 23 in a coil case 20 and a superconducting coil 30, it is preferred to use one containing norbornene-based monomers and a catalyst solution, which will be described below.

As the norbornene-based monomer, that is, as the monomer having a norbornene ring structure, a bicyclic such as norbornene, or norbornadiene; a tricyclic such as dicyclopentadiene (a cyclopentadiene dimer), or dihydrodicyclopentadien; a tetracyclic such as tetracyclododecene; a pentacyclic such as a cyclopentadiene trimer; a heptacyclic such as a cyclopentadiene tetramer; or the like can be mentioned. These norbornene-based monomers may have a substituent, for example, an alkyl group such as a methyl group, an ethyl group, a propyl group, or a butyl group; an alkenyl group such as a vinyl group; an alkylidene group such as an ethylidene group; an aryl group such as a phenyl group, a tolyl group, or a naphthyl group; or the like. Further, these norbornene-based monomers may have a polar group such as a carboxyl group, an alkoxycarbonyl group, an acyloxy group, an oxy group, a cyano group, or a halogen atom.

Specific examples of such a norbornene-based monomer include dicyclopentadiene (DCPD), tricyclopentadiene (TCPD), a cyclopentadiene-methylcyclopentadiene codimer, 5-ethylidene norbornene, norbornene, norbornadiene, 5-cyclohexenylnorbornene, 1,4,5,8-dimethano-1,4,4a,5,6,7,8,8a-octahydronaphthalene, 1,4-methano-1,4,4a,5,6,7,8,8a-octahydronaphthalene, 6-ethylidene-1,4,5,8-dimethano-1,4,4a,5,6,7,8,8a-octahydronaphthalene, 6-ethylidene-1,4-methano-1,4,4a,5,6,7,8,8a-octahydronaphthalene, 1,4,5,8-dimethano-1,4,4a,5,6,7,8,8a-hexahydronaphthalene, and ethylene bis (5-norbornene). The norbornene-based monomers may be used singly alone or in combination of two or more kinds thereof.

Among the above-described norbornene-based monomers, from the viewpoint of being easy to obtain, excellent in the reactivity, and excellent in the heat resistance of the norbornene-based resin to be obtained, a tricyclic, tetracyclic, or pentacyclic norbornene-based monomer is preferred, a tricyclic norbornene-based monomer is more preferred, and dicyclopentadiene is particularly preferred.

In this regard, it can be analyzed whether or not the polymer has a norbornene ring structure by using, for example, nuclear magnetic resonance (NMR).

Suitably, the polymer 51 is made of a copolymer obtained by polymerizing, that is, copolymerizing a first monomer having a norbornene ring structure and a second monomer having a norbornene ring structure and being a monomer of a kind different from the kind of the first monomer. In this regard, the first monomer is made of dicyclopentadiene. The second monomer is made of one or more kinds of the compounds represented by the above-described general formula (1), and preferably made of one or more kinds selected from the group consisting of norbornene, tetracyclododecene, 5-ethylidene norbornene, 8-ethylidene tetracyclododecene, and tricyclopentadiene.

Further, in the above-described general formula (1), examples of the hydrocarbon group having from 1 to 20 carbon atoms represented independently by each of $R^1$ to $R^4$ include: an alkyl group having from 1 to 20 carbon atoms such as a methyl group, an ethyl group, or a propyl group; an aryl group having from 6 to 20 carbon atoms such as a phenyl group, or a 2-naphthyl group; and a cycloalkyl group having from 3 to 20 carbon atoms such as a cyclopropyl group, a cyclopentyl group, or a cyclohexyl group. Examples of the alkylidene group formed by $R^1$ and $R^2$ or $R^3$ and $R^4$ in combination include a methylidene group ($=CH_2$), an ethylidene group ($=CH-CH_3$), and a propylidene group ($=CH-C_2H_5$). Further, examples of the ring structure formed by $R^1$ and/or $R^2$ and $R^3$ and/or $R^4$ include a cyclopentane ring, a cyclopentene ring, a cyclohexane ring, and a cyclohexene ring.

In a case where the polymer 51 is formed by polymerizing a first monomer of the kind described above and a second monomer of the kind described above in combination, as compared with the case where the polymer 51 is formed by polymerizing monomers in a combination other than the combination of the above kinds of first and second monomers, the amount of shrinkage when a polymerizable composition 52 is cured is decreased during the production of a superconducting coil device 10. As a result, after the curing of the polymerizable composition 52, the stress applied to a superconducting coil 30 or a resin part 50 formed of the polymer 51 is decreased due to the curing, and therefore, after the polymerization and curing of the polymerizable composition 52, the generation of voids or cracks in the resin part 50 formed of the polymer 51, that is, the breaking of the resin part 50, can be prevented or suppressed. Further, during the use of the superconducting coil device 10, the stress applied to the superconducting coil 30 or the resin part 50 formed of the polymer 51 is decreased when the superconducting coil device 10 is cooled, and therefore, during the use of the superconducting coil device 10, the effect of preventing or suppressing the generation of voids or cracks in the resin part 50 formed of the polymer 51, that is, the breaking of the resin part 50, is further increased.

More suitably, the content of the second monomers in the polymerizable composition 52 is 4 parts by mass or more when the total content of the first monomers in the polymerizable composition 52 and the second monomers in the polymerizable composition 52, which are used as raw materials for the polymer 51, is taken as 100 parts by mass. That is, the content of the first monomers in the polymerizable composition 52 is 96 parts by mass or less.

In a case where the content of the second monomers in the polymerizable composition 52 is 4 parts by mass or more, as compared with the case where the content of the second monomers in the polymerizable composition 52 is less than 4 parts by mass, the excessive crosslinking is suppressed and the amount of shrinkage is further decreased when the polymerizable composition 52 is cured during the production of a superconducting coil device 10. As a result, after the polymerization and curing of the polymerizable composition 52, the stress applied to a superconducting coil 30 or a resin part 50 formed of the polymer 51 is further decreased due to the curing, and therefore, after the curing of the polymerizable composition 52, the generation of voids or cracks in the resin part 50 formed of the polymer 51, that is, the breaking of the resin part 50, can be further prevented or further suppressed. Further, during the use of the superconducting coil device 10, the stress applied to a superconducting coil 30 or a resin part 50 formed of the polymer 51 is also further decreased when the superconducting coil device 10 is cooled, and therefore, during the use of the superconducting coil device 10, the effect of preventing or suppressing the generation of cracks in the resin part 50 formed of the polymer 51, that is, the breaking of the resin part 50, is further increased.

However, suitably, the content of the second monomers in the polymerizable composition 52 is 50 parts by mass or less when the total content of the first monomers in the polymerizable composition 52 and the second monomers in the polymerizable composition 52 is taken as 100 parts by mass. That is, the content of the first monomers in the polymerizable composition 52 is 50 parts by mass or more. More suitably, the content of the second monomers is 5 parts by mass or more and 45 parts by mass or less, and even more suitably, the content of the second monomers is 6 parts by mass or more and 40 parts by mass or less.

In a case where the content of the second monomers in the polymerizable composition 52 is 50 parts by mass or less, as compared with the case where the content of the second monomers in the polymerizable composition 52 exceeds 50 parts by mass, when the polymerizable composition 52 is polymerized and cured during the production of a superconducting coil device 10, a more preferable polymerized and cured product having a stable chemical structure is obtained by crosslinking.

In this regard, by performing, for example, NMR analysis on the polymer 51, it can be analyzed whether or not the polymer 51 is formed by polymerizing a first monomer and a second monomer, and the content of each of the first monomers and second monomers in the polymer 51 can be measured.

As described above, the polymerizable composition 52 preferably contains a catalyst component of a metathesis polymerization catalyst system. The metathesis polymerization catalyst is not particularly limited as long as the norbornene-based monomer can be subjected to ring-opening polymerization, and a known one can be used.

The metathesis polymerization catalyst to be used in the present invention is a complex formed by binding a transition metal atom as the center atom, and a plurality of ions, atoms, multi-atomic ions, and/or compounds. As the transition metal atom, atoms of Groups 5, 6 and 8 (Long-period type Periodic Table, hereinafter referred to the same) are used. Although the atoms of each of the Groups are not particularly limited, the atoms of Group 5 include, for example, tantalum, the atoms of Group 6 include, for example, molybdenum and tungsten, and the atoms of Group 8 include, for example, ruthenium and osmium. Among these transition metal atoms, ruthenium and osmium of Group 8 are preferred. In other words, the metathesis polymerization catalyst to be used in the present invention is preferably a complex with ruthenium or osmium as the center atom, and more preferably a complex with ruthenium as the center atom. As the complex with ruthenium as the center atom, a ruthenium-carbene complex formed by coordinating a carbene compound with ruthenium is preferred. In this regard, the term "carbene compound" collectively refers to a compound having a methylene free radical, and is referred to as a compound having a divalent carbon atom (carbene carbon) that is not electrically charged, as represented by (>C:). Since the ruthenium-carbene complex has excellent catalytic activity during the bulk ring-opening polymerization, the polymer to be obtained has less odor originated from unreacted monomers, and a high-quality polymer is obtained with favorable productivity. In addition, the complex is relatively stable against oxygen, or water in the air, and is less likely to be deactivated, and therefore, the complex can be used in the atmospheric air. The metathesis polymerization catalyst may be used singly alone or in combination of a plurality of kinds thereof.

As the ruthenium-carbene complex, a complex represented by the following general formula (2) or general formula (3) can be mentioned.

[Chemical formula 2]

(2)

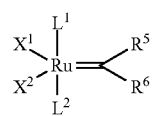

(3)

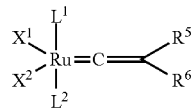

In the above-described general formulas (2) and (3), each of $R^5$ and $R^6$ is independently a hydrogen atom; a halogen atom; or an organic group having from 1 to 20 carbon atoms that may contain a halogen atom, an oxygen atom, a nitrogen atom, a sulfur atom, a phosphorus atom, or a silicon atom, and these groups may have a substituent, or may be bound to each other to form a ring. Examples of $R^5$ and $R^6$ that are bound to each other to form a ring include an indenylidene group that may have a substituent such as a phenylindenylidene group.

Specific examples of the organic group having from 1 to 20 carbon atoms that may contain a halogen atom, an oxygen atom, a nitrogen atom, a sulfur atom, a phosphorus atom, or a silicon atom include an alkyl group having from 1 to 20 carbon atoms, an alkenyl group having from 2 to 20 carbon atoms, an alkynyl group having from 2 to 20 carbon atoms, an aryl group having from 6 to 20 carbon atoms, an alkoxy group having from 1 to 20 carbon atoms, an alkenyloxy group having from 2 to 20 carbon atoms, an alkynyloxy group having from 2 to 20 carbon atoms, an aryloxy group having from 6 to 20 carbon atoms, an alkylthio group having from 1 to 8 carbon atoms, a carbonyloxy group, an alkoxycarbonyl group having from 1 to 20 carbon atoms, an alkylsulfonyl group having from 1 to 20 carbon atoms, an alkylsulfinyl group having from 1 to 20 carbon atoms, an alkylsulfonic acid group having from 1 to 20 carbon atoms, an arylsulfonic acid group having from 6 to 20 carbon atoms, a phosphonic acid group, an arylphosphonic acid group having from 6 to 20 carbon atoms, an alkylammonium group having from 1 to 20 carbon atoms, and an arylammonium group having from 6 to 20 carbon atoms. These organic groups having from 1 to 20 carbon atoms that may contain a halogen atom, an oxygen atom, a nitrogen atom, a sulfur atom, a phosphorus atom, or a silicon atom may have a substituent. Examples of the substituent include an alkyl group having from 1 to 10 carbon atoms, an alkoxy group having from 1 to 10 carbon atoms, and an aryl group having from 6 to 10 carbon atoms.

Each of $X^1$ and $X^2$ independently represents any anionic ligand. The anionic ligand is referred to as a ligand having a negative electric charge when separated from a center metal atom, and examples of the anionic ligand include a halogen atom, a diketonate group, a substituted cyclopentadienyl group, an alkoxyl group, an aryloxy group, and a carboxyl group.

$L^1$ and $L^2$ each represent a heteroatom-containing carbene compound or a neutral electron donating compound other than the heteroatom-containing carbene compound. The heteroatom-containing carbene compound and the neutral electron donating compound other than the heteroatom-containing carbene compound are compounds each having a neutral electric charge when separated from the center metal. A heteroatom-containing carbene compound is preferred from the viewpoint of improving the catalytic activity. The heteroatom means atoms of Groups 15 and 16 of the Periodic Table, and specific examples of the heteroatom include a nitrogen atom, an oxygen atom, a phosphorus atom, a sulfur atom, an arsenic atom, and a selenium atom. Among them, a nitrogen atom, an oxygen atom, a phosphorus atom, and a sulfur atom are preferred, and a nitrogen atom is more preferred, from the viewpoint of obtaining the stable carbene compound.

As the above-described heteroatom-containing carbene compound, a compound represented by the following general formula (4) or (5) is preferred, and, from the viewpoint of improving the catalytic activity, a compound represented by the following general formula (4) is more preferred.

[Chemical formula 3]

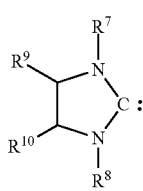

(4)

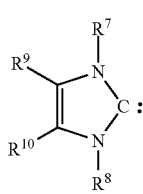

(5)

In the above-described general formulas (4) and (5), each of $R^7$, $R^8$, $R^9$ and $R^{10}$ independently represents a hydrogen atom; a halogen atom; or an organic group having from 1 to 20 carbon atoms that may contain a halogen atom, an oxygen atom, a nitrogen atom, a sulfur atom, a phosphorus atom, or a silicon atom. Specific examples of the organic group having from 1 to 20 carbon atoms that may contain a halogen atom, an oxygen atom, a nitrogen atom, a sulfur atom, a phosphorus atom, or a silicon atom are similar to those in the cases of the above-described general formulas (2) and (3). Further, $R^1$, $R^8$, $R^9$ and $R^{10}$ may be bound to each other in any combination thereof to form a ring.

In this regard, from the viewpoint that the effects of the present invention become more remarkable, it is preferred that $R^9$ and $R^{10}$ are hydrogen atoms. In addition, each of $R^7$ and $R^8$ is preferably an aryl group that may have a substituent, more preferably a phenyl group having an alkyl group having from 1 to 10 carbon atoms as the substituent, and even more preferably a mesityl group.

Examples of the above-described neutral electron donating compound include an oxygen atom, water, carbonyls, ethers, nitriles, esters, phosphines, phosphinites, phosphites, sulfoxides, thioethers, amides, imines, aromatics, cyclic diolefins, olefins, isocyanides, and thiocyanates.

In the above-described general formulas (2) and (3), $R^5$, $R^6$, $X^1$, $X^2$, $L^1$ and $L^2$ each of which may be bound solely to form a polydentate chelating ligand, and/or which may be bound to each other in any combination thereof to form a polydentate chelating ligand.

In addition, as the ruthenium-carbene complex to be used in the present invention, among the compounds represented by the above-described general formula (2) or (3), a compound represented by the above-described general formula (2) is preferred, from the viewpoint of making the effects of the present invention more remarkable. In particular, the complex is more preferably a compound represented by the general formula (6) or the general formula (7) shown below.

The general formula (6) is shown below.

[Chemical Formula 4]

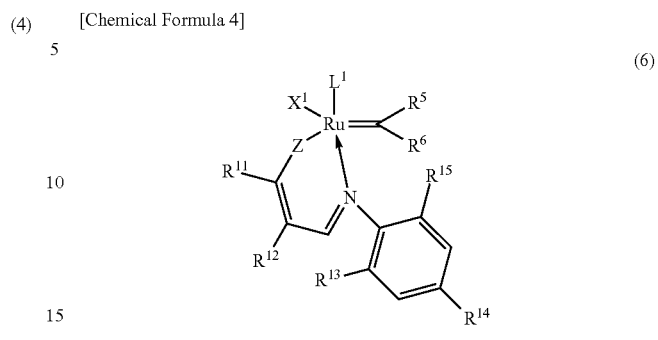

(6)

In the above-described general formula (6), Z is an oxygen atom, a sulfur atom, a selenium atom, $NR^{16}$, $PR^{16}$ or $AsR^{16}$, in which $R^{16}$ is a hydrogen atom; a halogen atom; or an organic group having from 1 to 20 carbon atoms that may contain a halogen atom, an oxygen atom, a nitrogen atom, a sulfur atom, a phosphorus atom, or a silicon atom. Since the effects of the present invention are even more remarkable, it is preferred that Z is an oxygen atom.

In this regard, $R^5$, $R^6$, $X^1$ and $L^1$ are similar to those in the cases of the above-described general formulas (2) and (3), each of which may be bound solely to form a polydentate chelating ligand, and/or which may be bound to each other in any combination thereof to form a polydentate chelating ligand. It is preferred that $X^1$ and $L^1$ do not form a polydentate chelating ligand, and that $R^5$ and $R^6$ are bound to each other to form a ring, more preferably an indenylidene group that may have a substituent, and even more preferably a phenylindenylidene group. In addition, specific examples of the organic group having from 1 to 20 carbon atoms that may contain a halogen atom, an oxygen atom, a nitrogen atom, a sulfur atom, a phosphorus atom, or a silicon atom are similar to those in the cases of the above-described general formulas (2) and (3).

In the above-described general formula (6), each of $R^{11}$ and $R^{12}$ is independently a hydrogen atom, an alkyl group having from 1 to 20 carbon atoms, an alkenyl group having from 2 to 20 carbon atoms, or a heteroaryl group having from 6 to 20 carbon atoms, and these groups may have a substituent, or may be bound to each other to form a ring. Examples of the substituent include an alkyl group having from 1 to 10 carbon atoms, an alkoxy group having from 1 to 10 carbon atoms, and an aryl group having from 6 to 10 carbon atoms. The ring in a case of forming a ring may be any one of an aromatic ring, an alicyclic ring, and a heterocyclic ring. It is preferred that an aromatic ring is formed, it is more preferred that an aromatic ring having from 6 to 20 carbon atoms is formed, and it is even more preferred that an aromatic ring having from 6 to 10 carbon atoms is formed.

In the above-described general formula (6), each of $R^{13}$, $R^{14}$ and $R^{15}$ is independently a hydrogen atom; a halogen atom; or an organic group having from 1 to 20 carbon atoms that may contain a halogen atom, an oxygen atom, a nitrogen atom, a sulfur atom, a phosphorus atom, or a silicon atom, and these groups may have a substituent, or may be bound to each other to form a ring. In addition, specific examples of the organic group having from 1 to 20 carbon atoms that may contain a halogen atom, an oxygen atom, a nitrogen atom, a sulfur atom, a phosphorus atom, or a silicon atom are similar to those in the cases of the above-described general formulas (2) and (3). It is preferred that $R^{13}$, $R^{14}$ and $R^{15}$ are a hydrogen atom or an alkyl group having from 1 to 20 carbon atoms, and more preferably a hydrogen atom or an alkyl group having from 1 to 3 carbon atoms.

In this regard, specific examples of the compound represented by the above-described general formula (6) and the production method thereof include those described in, for example, WO 2003/062253 A (JP 2005-515260 A), and the like.

The general formula (7) is shown below.

[Chemical formula 5]

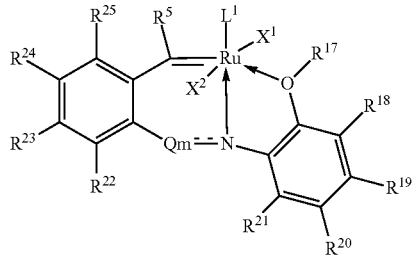

(7)

In the above-described general formula (7), m is 0 or 1. m is preferably 1, and in that case, Q is an oxygen atom, a nitrogen atom, a sulfur atom, a methylene group, an ethylene group, or a carbonyl group, and preferably a methylene group.

[Chemical formula 6]

--- is a single bond or a double bond, and preferably a single bond.

$R^5$, $X^1$, $X^2$ and $L^1$ are similar to those in the cases of the above-described general formulas (2) and (3), each of which may be bound solely to form a polydentate chelating ligand, and/or which may be bound to each other in any combination thereof to form a polydentate chelating ligand. It is preferred that $X^1$, $X^2$ and $L^1$ do not form a polydentate chelating ligand, and $R^5$ is a hydrogen atom.

$R^{17}$ to $R^{25}$ are each a hydrogen atom; a halogen atom; or an organic group having from 1 to 20 carbon atoms that may contain a halogen atom, an oxygen atom, a nitrogen atom, a sulfur atom, a phosphorus atom, or a silicon atom, and these groups may have a substituent, or may be bound to each other to form a ring. In addition, specific examples of the organic group having from 1 to 20 carbon atoms that may contain a halogen atom, an oxygen atom, a nitrogen atom, a sulfur atom, a phosphorus atom, or a silicon atom are similar to those in the cases of the above-described general formulas (2) and (3).

$R^{17}$ is preferably an alkyl group having from 1 to 20 carbon atoms, and more preferably an alkyl group having from 1 to 3 carbon atoms, $R^{18}$ to $R^{21}$ are each preferably a hydrogen atom, and $R^{22}$ to $R^{25}$ are each preferably a hydrogen atom or a halogen atom.

In this regard, specific examples of the compound represented by the above-described general formula (7) and the production method thereof include those described in, for example, WO 2011/079799 A (JP 2013-516392 A), and the like.

In addition, as the compound represented by the above-described general formula (2), in addition to the compound represented by the above-described general formula (6) or general formula (7), the following compound (8) can also be preferably used. In the compound (8), $PCy_3$ represents tricyclohexylphosphine, and Mes represents a mesityl group.

[Chemical formula 7]

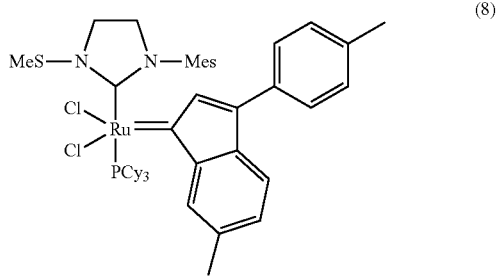

(8)

The content of the metathesis polymerization catalyst is preferably from 0.005 mmol or more, more preferably from 0.01 to 50 mmol, and even more preferably from 0.015 to 20 mmol, per one mol of the total content of the monomers to be used in the reaction.

From the viewpoint of improving the adhesion between the polymer obtained after the polymerization and curing and the others, the polymerizable composition may contain a radical generator, a diisocyanate compound, a polyfunctional (meth)acrylate compound, and other optional components, as needed.

The amount of the radical generator in the polymerizable composition is usually from 0.1 to 10 parts by mass, and preferably from 0.5 to 5 parts by mass, based on 100 parts by mass of the total content of the monomers to be used. As the radical generator, an organic peroxide, a diazo compound, or a nonpolar radical generator can be mentioned. Examples of the organic peroxide include hydroperoxides such as t-butyl hydroperoxide, p-menthanehydroperoxide, and cumene hydroperoxide; dialkyl peroxides such as di-t-butyl peroxide, dicumyl peroxide, and t-butyl cumyl peroxide; diacyl peroxides such as dipropionyl peroxide, and benzoyl peroxide; peroxyketals such as 2,5-dimethyl-2,5-di(t-butylperoxy)hexane, 2,5-dimethyl-2,5-di(t-butylperoxy)-3-hexyne, and 1,3-di(t-butylperoxyisopropyl)benzene; peroxyesters such as t-butyl peroxyacetate, and t-butyl peroxybenzoate; peroxy carbonates such as t-butyl peroxy isopropylcarbonate, and di(isopropylperoxy)dicarbonate; and an alkylsilyl peroxide such as t-butyl trimethylsilyl peroxide. Examples of the diazo compound include 4,4'-bisazidobenzal (4-methyl)cyclohexanone, 4,4'-diazidochalcone, 2,6-bis(4'-azidobenzal)cyclohexanone, 2,6-bis(4'-azidobenzal)-4-methylcyclohexanone, 4,4'-diazidodiphenylsulfone, 4,4'-diazidodiphenylmethane, and 2,2'-diazidostilbene. Examples of the nonpolar radical generator include 2,3-dimethyl-2,3-diphenylbutane, 2,3-diphenylbutane, 1,4-diphenylbutane, 3,4-dimethyl-3,4-diphenylhexane, 1,1,2,2-tetraphenylethane, 2,2,3,3-tetraphenylbutane, 3,3,4,4-tetraphenylhexane, 1,1,2-triphenylpropane, 1,1,2-triphenylethane, triphenylmethane, 1,1,1-triphenylethane, 1,1,1-triphenylpropane, 1,1,1-triphenylbutane, 1,1,1-triphenylpentane, 1,1,1-triphenyl-2-propene, 1,1,1-triphenyl-4-pentene, and 1,1,1-triphenyl-2-phenylethane.

The amount of the diisocyanate compound to be mixed with the polymerizable composition is preferably from 0.5 to 20 parts by mass, more preferably from 1 to 15 parts by mass, and even more preferably from 2 to 10 parts by mass, based on 100 parts by mass of the total content of the monomers to be used. Examples of the diisocyanate compound include an aromatic diisocyanate compound such as 4,4'-methylenediphenyl diisocyanate (MDI), toluene-2,4-diisocyanate, 4-methoxy-1,3-phenylene diisocyanate, 4-isopropyl-1,3-phenylene diisocyanate, 4-chloro-1,3-phenylene diisocyanate, 4-butoxy-1,3-phenylene diisocyanate, 2,4-diisocyanate diphenyl ether, 1,4-phenylene diisocyanate, tolylene diisocyanate, xylylene diisocyanate (XDI), 1,5-naphthalene diisocyanate, benzidine diisocyanate, o-nitrobenzidine diisocyanate, or 4,4'-diisocyanate dibenzyl; an aliphatic diisocyanate compound such as methylene diisocyanate, 1,4-tetramethylene diisocyanate, 1,6-hexamethylene diisocyanate, or 1,10-decamethylene diisocyanate; an alicyclic diisocyanate compound such as 4-cyclohexylene diisocyanate, 4,4'-methylenebis(cyclohexyl isocyanate), 1,5-tetrahydronaphthalene diisocyanate, isophorone diisocyanate, hydrogenated MDI, or hydrogenated XDI; and a polyurethane prepolymer obtained by reacting these diisocyanate compounds with a low-molecular weight polyol or a polyamine so as to have an isocyanate at the terminal.

The amount of the polyfunctional acrylate compound to be mixed with the polymerizable composition is preferably from 0.5 to 20 parts by mass, more preferably from 1 to 15 parts by mass, and even more preferably from 2 to 10 parts by mass, based on 100 parts by mass of the total content of the monomers to be used. Examples of the polyfunctional acrylate compound include ethylene glycol dimethacrylate, triethylene glycol dimethacrylate, trimethylolpropane trimethacrylate, and neopentyl glycol dimethacrylate.

Examples of other optional components include an activator, an activity regulator, an elastomer, and an antioxidant.

The activator is a compound that acts as a cocatalyst of the above-described metathesis polymerization catalyst, and improves the polymerization activity of the catalyst. As the activator, for example, an alkylaluminum halide such as ethyl aluminum dichloride, or diethyl aluminum chloride; an alkoxyalkylaluminum halide in which a part of alkyl groups of these alkylaluminum halides is substituted by an alkoxy group; an organotin compound; or the like may be used. The amount of the activator to be used is not particularly limited, and is usually preferably from 0.1 to 100 mol, and more preferably from 1 to 10 mol, based on one mol of the total content of the metathesis polymerization catalysts to be used in the polymerizable composition.

The activity regulator is used for preventing the start of polymerization during the course of injection, when two or more reactive stock solutions are mixed to prepare a polymerizable composition, and the polymerizable composition is injected into a mold in order to start the polymerization.

As the activity regulator in a case of using a compound of a transition metal of Group 5 or Group 6 in the Periodic Table as a metathesis polymerization catalyst, a compound having an action to reduce the metathesis polymerization catalyst, or the like can be mentioned, and alcohols, halo alcohols, esters, ethers, nitriles, or the like can be used. Among them, alcohols and halo alcohols are preferred, and halo alcohols are more preferred.

Specific examples of the alcohols include n-propanol, n-butanol, n-hexanol, 2-butanol, isobutyl alcohol, isopropyl alcohol, and t-butyl alcohol. Specific examples of the halo alcohols include 1,3-dichloro-2-propanol, 2-chloroethanol, and 1-chlorobutanol.

As the activity regulator in a case of using particularly a ruthenium-carbene complex as a metathesis polymerization catalyst, a Lewis base compound can be mentioned. Examples of the Lewis base compound include a Lewis base compound containing a phosphorus atom such as tricyclopentyl phosphine, tricyclohexyl phosphine, triphenyl phosphine, triphenyl phosphite, or n-butyl phosphine; and a Lewis base compound containing a nitrogen atom such as n-butylamine, pyridine, 4-vinylpyridine, acetonitrile, ethylenediamine, N-benzylidene methylamine, pyrazine, piperidine, or imidazole. Further, a norbornene substituted by an alkenyl group such as vinylnorbornene, propenylnorbornene, or isopropenylnorbornene acts as a monomer, and also acts as an activity regulator at the same time. The amount of these active regulators to be used may be properly adjusted depending upon the compound to be used.

Examples of the elastomer include natural rubber, polybutadiene, polyisoprene, a styrene-butadiene copolymer (SBR), a styrene-butadiene-styrene block copolymer (SBS), a styrene-isoprene-styrene copolymer (SIS), an ethylene-propylene-diene terpolymer (EPDM), an ethylene-vinyl acetate copolymer (EVA), and hydrogenated products thereof. By dissolving an elastomer in the polymerizable composition and using the resultant mixture, the viscosity of the elastomer can be controlled. Further, with the addition of an elastomer, the impact resistance of the polymer to be obtained can be improved. The amount of the elastomer to be used is preferably from 0.5 to 20 parts by mass, and more preferably from 2 to 10 parts by mass, based on 100 parts by mass of the total content of the monomers in the polymerizable composition.

As the antioxidant, various kinds of antioxidants for plastic and rubber, such as a phenolic antioxidant, a phosphorus-based antioxidant, and an amine-based antioxidant can be mentioned.

Further, the polymerizable composition may contain a filler as an optional component within the range that the viscosity of the polymerizable composition is suitable as described below. The filler is not particularly limited, and examples of the filler include a fibrous filler having an aspect ratio of 5 to 100, and a particulate filler having an aspect ratio of 1 to 2. In addition, the fibrous filler and the particulate filler may be used in combination.

Specific examples of the fibrous filler include glass fibers, wollastonite, potassium titanate, xonotlite, basic magnesium sulfate, aluminum borate, tetrapod-type zinc oxide, gypsum fibers, phosphate fibers, alumina fibers, acicular calcium carbonate, and acicular boehmite.

Specific examples of the particulate filler include calcium carbonate, calcium hydroxide, calcium silicate, calcium sulfate, aluminum hydroxide, magnesium hydroxide, titanium oxide, zinc oxide, barium titanate, silica, alumina, carbon black, graphite, antimony oxide, red phosphorus, various kinds of metal powders, clay, various kinds of ferrites, and hydrotalcite. For example, if alumina is used as a filler, the thermal conductivity in a resin part 50 can be improved. Further, if silica is used as a filler, the thermal shrinkage in a resin part 50 can be adjusted.

In addition, as the above-described filler, a filler whose surface has been hydrophobized is preferred. By using a hydrophobized filler, the aggregation and precipitation of the filler in a polymerizable composition 52 can be prevented, and the dispersion of the filler in a polymer 51 can be made uniform. Examples of the treatment agent for use in the hydrophobic treatment include a silane coupling agent such as vinyltrimethoxysilane, a titanate-based coupling agent, an aluminum-based coupling agent, fatty acid such as stearic acid, fat and oil, a surfactant, and wax. The hydrophobic treatment of a filler can be performed by mixing a hydrophobic treatment agent at the same time when a polymerizable composition 52 is prepared, however, it is preferred to prepare the polymerizable composition 52 by using a filler that has been previously hydrophobized.

<Method for Producing Superconducting Coil Device>

Figure 7:
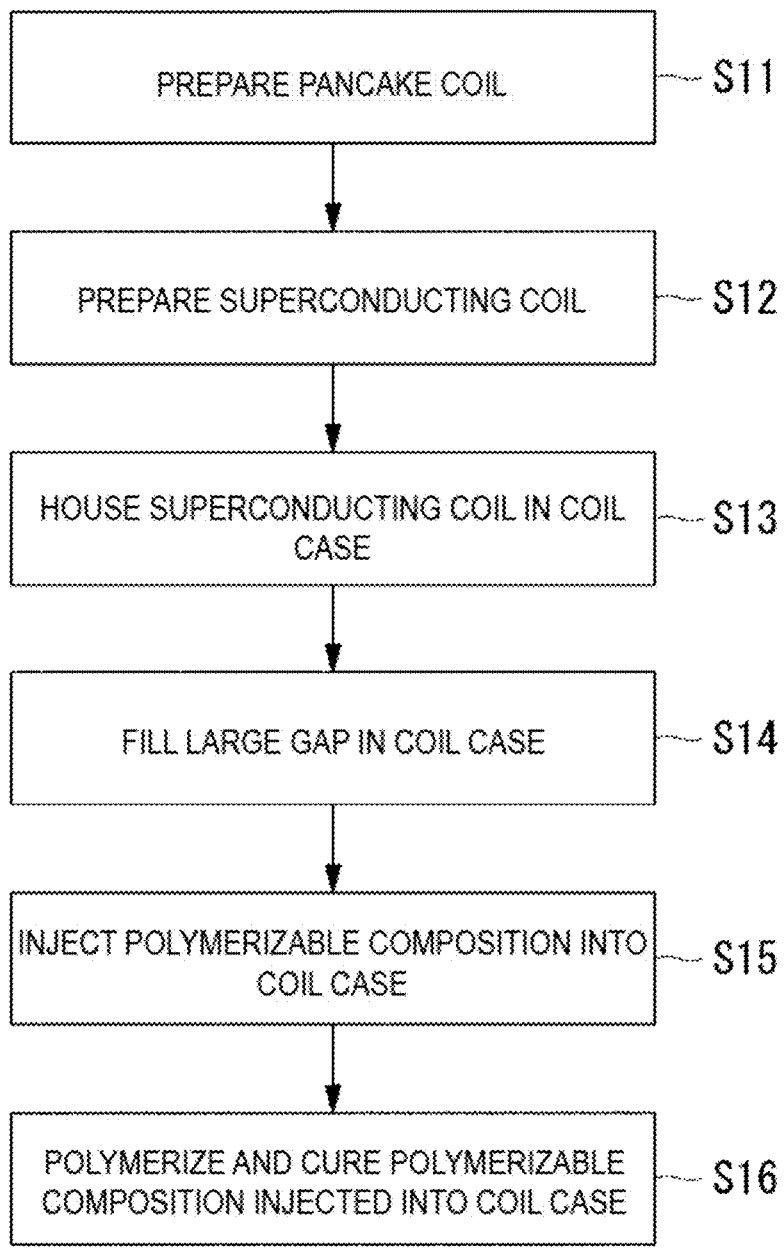
FIG. 7 is a process flow diagram showing part of the production process of a superconducting coil device according to an embodiment.
Figure 8:
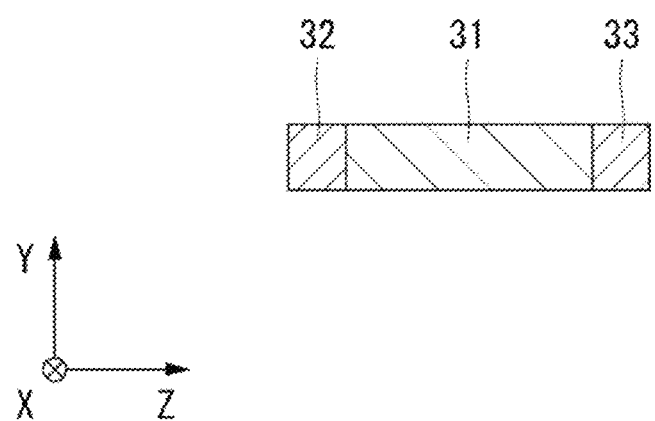
FIG. 8 is a cross-sectional view of the main part in the production process of a superconducting coil device according to an embodiment.
Figure 9:
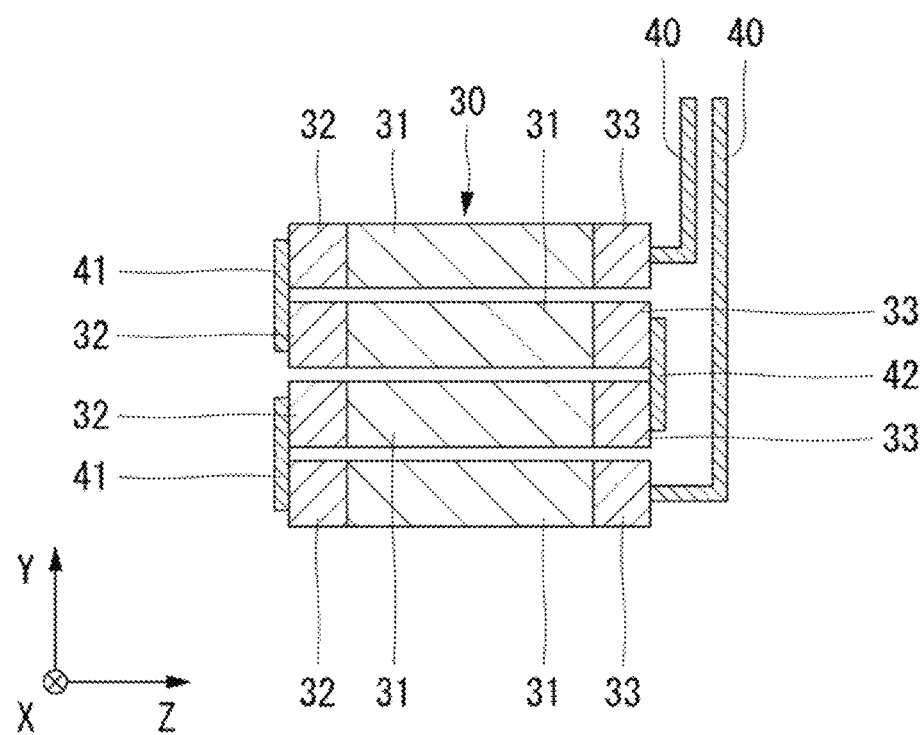
FIG. 9 is a cross-sectional view of the main part in the production process of a superconducting coil device according to an embodiment.
Figure 10:
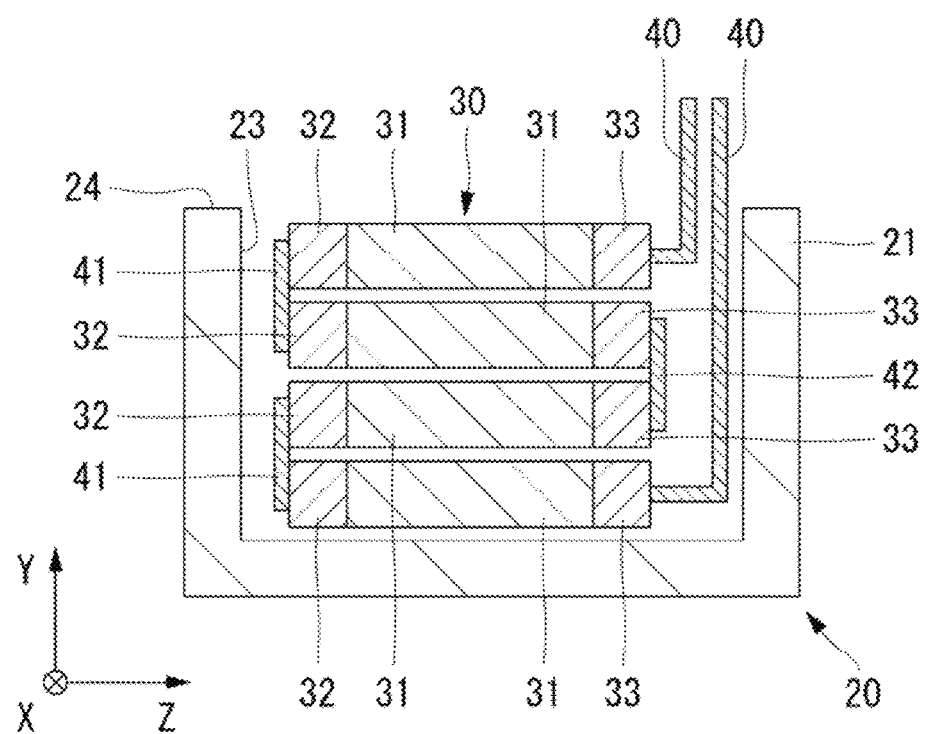
FIG. 10 is a cross-sectional view of the main part in the production process of a superconducting coil device according to an embodiment.

Next, the method for producing a superconducting coil device according to the present embodiment will be described. FIG. 7 is a process flow diagram showing part of the production process of a superconducting coil device according to the embodiment. FIGS. 8 to 10 are each a cross-sectional view of the main part in the production process of a superconducting coil device according to the embodiment. In this regard, the cross sections of the main parts shown in FIGS. 8 to 10 each correspond to the cross section of the main part shown in FIG. 4.

Hereinafter, a case where the superconducting coil device has a superconducting coil containing a plurality of pancake coils disposed one on another in layers will be described as an example. However, the superconducting coil device may have a superconducting coil formed by winding a superconducting wire integrally or continuously.

First, as shown in FIG. 8, a pancake coil 31 is prepared (step S11 in FIG. 7). In this step S11, a pancake coil 31 is prepared by winding a superconducting wire in a spiral form around an axis AX1 (see FIG. 2). The pancake coil 31 has an inner electrode 32, and an outer electrode 33.

As shown in FIG. 8, three directions intersecting with one another and suitably perpendicular to one another are taken as an X-axis direction, a Y-axis direction, and a Z-axis direction. Further, the axis AX1 (see FIG. 2) is taken to be an axis along the Y-axis direction. For example, in the production process of a superconducting coil device, the Y-axis direction can be taken as the vertical direction, and the plane along the X-axis direction and the Z-axis direction can be taken as the horizontal plane.

Next, as shown in FIG. 9, a superconducting coil 30 is prepared (step S12 in FIG. 7). In this step S12, a plurality of pancake coils 31, each being prepared by winding a superconducting wire in a spiral form around an axis AX1 (see FIG. 2), are disposed one on another in layers, for example, in the Y-axis direction. Further, two inner electrodes 32 included respectively in two pancake coils 31 that are adjacent to each other in the layering direction are electrically connected to each other, and two outer electrodes 33 included respectively in two pancake coils 31 that are adjacent to each other in the layering direction are also electrically connected to each other, so that the plurality of pancake coils 31 disposed one on another in layers can be connected in series. In addition, in this step S12, current leads 40 are connected respectively to both ends of a superconducting coil 30 having the plurality of pancake coils 31 connected in series.

Specific methods for connecting the inner electrodes 32 to each other, for connecting the outer electrodes 33 to each other, and for connecting the current leads 40 to the outer electrodes 33 are as described with reference to FIG. 4 in the description of the superconducting coil device. For example, two inner electrodes 32 included respectively in two pancake coils 31 that are adjacent to each other in the layering direction are electrically connected to each other with a connection member 41. Further, two outer electrodes 33 that are included respectively in two pancake coils 31 that are adjacent to each other in the layering direction are electrically connected to each other with a connection member 42.

Next, as shown in FIG. 10, a superconducting coil 30 is housed in a coil case 20 (step S13 in FIG. 7). In this step S13, a superconducting coil 30 having a plurality of pancake coils 31 that have been disposed one on another in layers and been connected in series, and having current leads 40 connected to both ends of the superconducting coil 30, respectively is housed in a coil case 20 for housing a superconducting coil 30.

In the example shown in FIG. 10, the coil case 20 includes a container body part 21, and the container body part 21 has a recessed part 23. The container body part 21 has a main surface 24 intersecting with the Y-axis direction, and the recessed part 23 is formed on the main surface 24. In such a case, in step S13, a superconducting coil 30 is housed in the recessed part 23 of the coil case 20. In this way, after housing a superconducting coil 30 in the recessed part 23, a polymerizable composition 52 (see FIG. 4) can be easily injected into the recessed part 23, and a gap between an inner wall of the recessed part 23 and the superconducting coil 30 can be easily filled with a resin part 50 (see FIG. 4) formed of a polymer 51 (see FIG. 4).

Next, as shown in FIG. 4, a large gap in the coil case 20 is filled (step S14 in FIG. 7). In this step S14, by housing glass fibers, or a resin composition having a norbornene ring structure in a large gap between the inner wall of the coil case 20 and the superconducting coil 30, the large gap in the coil case 20 is filled. In the example shown in FIG. 4, a large gap between the inner wall of the recessed part 23 and the superconducting coil 30 is filled.

Next, as shown in FIG. 4, a polymerizable composition 52 is injected into the coil case 20 (step S15 in FIG. 7). In this step S15, a polymerizable composition 52 that is a raw material for a polymer 51 having a norbornene ring structure is injected into the coil case 20. In the example shown in FIG. 4, a polymerizable composition 52 is injected into the recessed part 23.

As such a polymerizable composition 52, a polymerizable composition containing a norbornene-based monomer such as a cyclic hydrocarbon having a norbornene ring structure, and a metathesis polymerization catalyst can be used. As the norbornene-based monomer, that is, a monomer having a norbornene ring structure, and the metathesis polymerization catalyst, ones described above can be used, respectively.

As described above, a case where a superconducting coil 30 is housed in a coil case 20, and then a polymerizable composition 52 that is a raw material for an epoxy is injected into a gap between an inner wall of the coil case 20 and the superconducting coil 30 is considered. In such a case, since the polymerizable composition 52 that is a raw material for an epoxy has a high viscosity, the polymerizable composition 52 has not been injected into a narrow gap in a part between the inner wall of the coil case 20 and the superconducting coil 30, and it has been difficult to eliminate voids from a part between the inner wall of the coil case 20 and the superconducting coil 30.

On the other hand, in the production process for a superconducting coil device according to the present embodiment, a superconducting coil 30 is housed in a coil case 20, and then a polymerizable composition 52 that is a raw material for a polymer 51 having a norbornene ring structure is injected into a gap between the inner wall of the coil case 20 and the superconducting coil 30.

The polymerizable composition to be used in the present invention is prepared by properly mixing the components described above with each other in accordance with a known method, or the polymerizable composition may be prepared by mixing two or more reactive stock solutions with each other immediately before the injection of the resultant mixture into the coil case 20 from an opening part 25 to be described later, an opening part 26 to be described later, or the like. The polymerizable composition is prepared by dividing the above-described components into two or more solutions so that the reactive stock solutions are not polymerized by a single solution alone, but when all of the solutions are mixed with each other, a polymerizable composition containing the components at a predetermined ratio is formed. Examples of the combination of two or more reactive stock solutions include the following two types, (i) and (ii), according to the kind of the metathesis polymerization catalyst to be used.

(i): As the above-described metathesis polymerization catalyst, a metathesis polymerization catalyst that does not have polymerization reaction activity when used alone, but exhibits polymerization reaction activity when used together with an activator can be used. In this case, with the use of a reactive stock solution (liquid A) containing a norbornene-based monomer and an activator and a reactive stock solution (liquid B) containing a norbornene-based monomer and a metathesis polymerization catalyst, a polymerizable composition can be obtained by mixing these solutions with each other.

Further, a reactive stock solution (liquid C) containing a norbornene-based monomer but not containing any one of a metathesis polymerization catalyst and an activator may be used in combination.

(ii): Further, in a case where a metathesis polymerization catalyst by itself alone having a polymerization reaction activity is used as the metathesis polymerization catalyst, a polymerizable composition can be obtained by mixing a reactive stock solution (liquid a) containing a norbornene-based monomer and a reactive stock solution (liquid b) containing a metathesis polymerization catalyst. As the reactive stock solution (liquid b) in this case, a solution or dispersion prepared by dissolving or dispersing a metathesis polymerization catalyst in a small amount of an inert solvent is usually used. Examples of such a solvent include an aromatic hydrocarbon such as toluene, xylene, ethylbenzene, or trimethylbenzene; ketones such as methyl ethyl ketone, cyclopentanone, cyclohexanone, 2-heptanone, and 4-hydroxy-4-methyl-2-pentanone; cyclic ethers such as tetrahydrofuran; diethyl ether; dichloromethane; dimethyl sulfoxide; and ethyl acetate. Among them, an aromatic hydrocarbon is preferred, and toluene is more preferred.

A radical generator, a diisocyanate compound, a polyfunctional (meth)acrylate compound, and an optional component may be contained in any one of the above-described reactive stock solutions, or may be added to any one of the above-described reactive stock solutions in the form of a liquid mixture other than the above-described reactive stock solutions.

As the mixing device used for mixing the above-described reaction stock solutions, for example, in addition to a collision mixing device that is generally used in a reaction injection-molding method, and further, a low-pressure mixer such as a dynamic mixer, or a static mixer, or the like can be mentioned.

In addition, in consideration of the durability or the like after the polymerization and curing, the polymerizable composition may be properly mixed with an additive such as an antioxidant, a flame retardant, a thermal stabilizer, an ultraviolet absorbent, or a photostabilizer.

The injection of the polymerizable composition is usually performed at an ordinary temperature of 10° C. to 30° C., and the activity regulator may be appropriately increased or decreased depending on the temperature or the liquid temperature of the polymerizable composition.

The viscosity at 25° C. of a polymerizable composition 52 that is a raw material for a polymer 51 having a norbornene ring structure is preferably 100 mPa·s or less, more preferably 80 mPa·s or less, and even more preferably 50 mPa·s or less, and is extremely lower than that of a polymerizable composition 52 that is a raw material for an epoxy.

As a result, the polymerizable composition 52 can be sufficiently injected even into a narrow gap in a part between an inner wall of a coil case 20 and a superconducting coil 30, and therefore, voids can be easily eliminated from a part between the inner wall of the coil case 20 and the superconducting coil 30. That is, the polymerizable composition 52 can be sufficiently injected even into a narrow gap in a part between the inner wall of the recessed part 23 and the superconducting coil 30, and therefore, air gaps can be easily eliminated from a part between the inner wall of the recessed part 23 and the superconducting coil 30.

Further, since the polymerizable composition 52 that is a raw material for a polymer 51 having a norbornene ring structure has low viscosity, even if vacuum defoaming is not performed, the polymerizable composition 52 can be sufficiently injected even into a narrow gap in a part between the inner wall of the coil case 20 and the superconducting coil 30. As a result, the production process of a superconducting coil device can be easily simplified.

Suitably, the polymerizable composition 52 contains a first monomer having a norbornene ring structure, and a second monomer having a norbornene ring structure and being a monomer of a kind different from the kind of the first monomer. In this regard, the first monomer is made of dicyclopentadiene, and the second monomer is made of one or more kinds of the compounds represented by the above-described general formula (1). The second monomer is preferably made of one or more kinds selected from the group consisting of norbornene, tetracyclododecene, 5-ethylidene norbornene, 8-ethylidene tetracyclododecene, and tricyclopentadiene.

In a case where the polymerizable composition 52 contains a combination of a first monomer of the kind described above and a second monomer of the kind described above, as described above, as compared with the case where the polymerizable composition 52 contains a combination of monomers of kinds other than the kinds of the above combination, the generation of voids or cracks in a resin part 50 formed of a polymer 51 obtained by polymerizing the polymerizable composition 52 can be prevented or suppressed after the polymerization and curing of the polymerizable composition 52. Further, during the use of a superconducting coil device 10 (see FIG. 4), the effect capable of preventing or suppressing the generation of voids or cracks in a resin part 50 is further increased.

More suitably, the content of the second monomers in the polymerizable composition 52 is 4 parts by mass or more when the total content of the first monomers in the polymerizable composition 52 and the second monomers in the polymerizable composition 52 is taken as 100 parts by mass. That is, the content of the first monomers in the polymerizable composition 52 is 96 parts by mass or less.

In a case where the content of the second monomers in the polymerizable composition 52 is 4 parts by mass or more, as described above, as compared with the case where the content of the second monomers in the polymerizable composition 52 is less than 4 parts by mass, the generation of voids or cracks in a resin part 50 can be further prevented or further suppressed after the polymerization and curing of the polymerizable composition 52. Further, during the use of a superconducting coil device 10 (see FIG. 4), the effect capable of preventing or suppressing the voids or cracks generated in a resin part 50 (see FIG. 4) is furthermore increased.

However, suitably, the content of the second monomers in the polymerizable composition 52 is 50 parts by mass or less when the total content of the first monomers in the polymerizable composition 52 and the second monomers in the polymerizable composition 52 is taken as 100 parts by mass. That is, the content of the first monomers in the polymerizable composition 52 is 50 parts by mass or more. More suitably, the content of the second monomers is 5 parts by mass or more and 45 parts by mass or less, and even more suitably, the content of the second monomers is 6 parts by mass or more and 40 parts by mass or less.

In a case where the content of the second monomers in the polymerizable composition 52 is 50 parts by mass or less, as compared with the case where the content of the second monomers in the polymerizable composition 52 exceeds 50 parts by mass, when a polymerizable composition 52 is polymerized and cured during the production of a superconducting coil device 10 (see FIG. 4), a more preferable polymerized and cured product having a stable chemical structure is obtained by crosslinking.

As shown in FIGS. 1 and 2, suitably, a coil case 20 includes an opening part 25 and an opening part 26. In a state that a lid part 22 is attached to a container body part 21, the opening part 25 is formed in a part on a first side (the opposite side of the arrow direction of the X-axis direction in FIG. 2) in the X-axis direction from the lid part 22 in a main surface 24 of the container body part 21, and communicates with a recessed part 23. That is, the opening part 25 is arranged closer to the first side than the recessed part 23 in the X-axis direction. In addition, in a state that the lid part 22 is attached to the container body part 21, the opening part 26 is formed in a part on the opposite side of the first side (the same side of the arrow direction of the X-axis direction in FIG. 2) in the X-axis direction from the lid part 22 in the main surface 24 of the container body part 21, and communicates with the recessed part 23. That is, the opening part 26 is arranged closer to the opposite side of the first side than the recessed part 23 in the X-axis direction. In such a case, in step S15, it is preferred to inject the polymerizable composition 52 into a coil case 20 while tilting the coil case 20.

Specifically, at first, by attaching a lid part 22 to a container body part 21, a recessed part 23 is closed with the lid part 22. Next, injection of a polymerizable composition 52 from an opening part 25 into the recessed part 23 is started in a state that a main surface 24 of the container body part 21 is tilted with respect to the horizontal plane so that the position of the opening part 25 is higher than that of an opening part 26. Next, the polymerizable composition 52 is injected into the recessed part 23 from the opening part 25 while gradually decreasing the tilting angle of the main surface 24 of the container body part 21 with respect to the horizontal plane so that the height difference between the opening part 25 and the opening part 26 is decreased.

In this way, the polymerizable composition 52 can be uniformly flowed and injected from a first side toward the opposite side of the first side in the X-axis direction in the recessed part 23 by using gravity, and therefore, a gap between an inner wall of the recessed part 23 and a superconducting coil 30 can be easily filled with the polymerizable composition 52. Further, mixture of bubbles into the polymerizable composition 52 can be prevented or suppressed.

Next, as shown in FIG. 4, the polymerizable composition 52 injected into the coil case 20 is polymerized and cured (step S16 in FIG. 7). In this step S16, a resin part 50 made of a polymer 51 is formed by polymerizing and curing the polymerizable composition 52 injected into a recessed part 23 to fill a gap between an inner wall of the recessed part 23 and a superconducting coil 30 with the formed resin part 50. The polymer 51 is formed by polymerizing the polymerizable composition 52 containing a first monomer having a norbornene ring structure. In a case where the polymerizable composition 52 contains a first monomer and a second monomer, the polymer 51 is formed by polymerizing the first monomer and the second monomer. In this way, a superconducting coil device 10 is produced.

The polymerization and curing of the polymerizable composition 52 in this step S16 may be performed in one stage, and from the viewpoint of sufficiently preventing or suppressing the generation of voids or cracks in the resin part 50, it is preferred to perform prepolymerization before performing the main polymerization. As the conditions of the prepolymerization, the polymerization temperature is usually 50° C. or less, and preferably 20 to 50° C., and the polymerization time is usually 5 minutes to 20 hours, and preferably 10 minutes to 10 hours.

For example, at first, the polymerizable composition 52 is prepolymerized under atmospheric pressure and at ordinary temperature to precure the polymerizable composition 52. Next, by subjecting the precured polymerizable composition 52 to heat treatment to perform the main polymerization, the polymerizable composition 52 is polymerized and cured, that is, the polymerization and curing of the polymerizable composition 52 is performed. The temperature at which this heat treatment is performed is preferably 250° C. or less. In this way, deterioration of the superconducting characteristics or the like of a superconducting wire contained in a superconducting coil 30 can be prevented or suppressed. Further, from the viewpoint of efficiently performing the polymerization and curing while preventing or suppressing the deterioration of the superconducting characteristics or the like of a superconducting wire, the temperature at which the heat treatment is performed is preferably 50 to 140° C., and more preferably 60 to 100° C. Although depending on the temperature, the time for performing the heat treatment is preferably 1 minute to 3 hours, and more preferably 30 minutes to 2 hours from the time when the temperature reached the desired temperature.

The prepolymerization and the main polymerization may be performed by increasing the polymerization temperature stepwise and/or continuously, respectively. Further, the prepolymerization and the main polymerization may be continuously performed by increasing the polymerization temperature stepwise and/or continuously.

Figure 11:
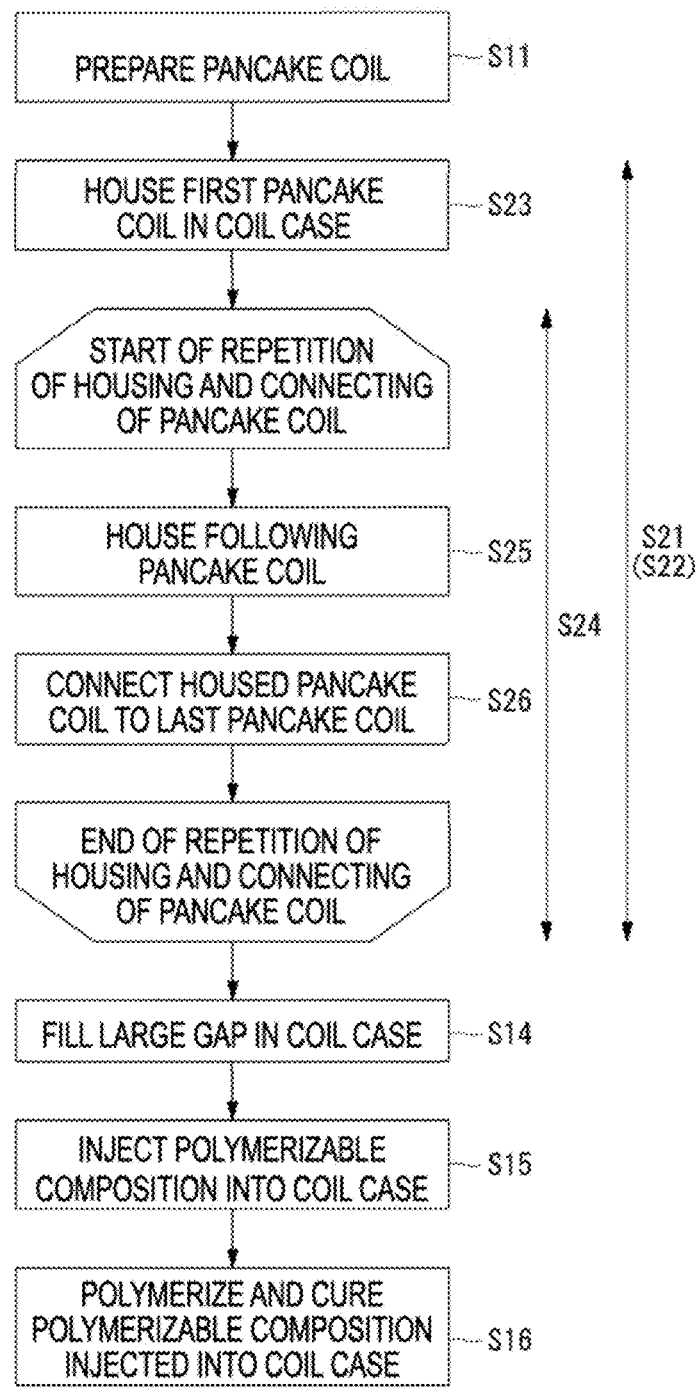
FIG. 11 is a process flow diagram showing part of the production process of a superconducting coil device according to a modified example of an embodiment.
Figure 12:
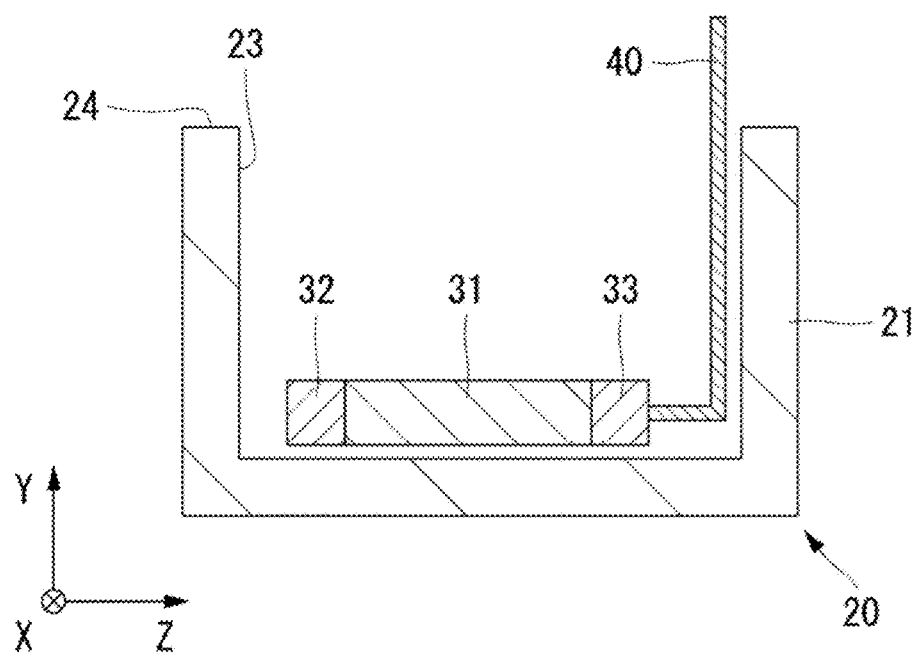
FIG. 12 is a cross-sectional view of the main part in the production process of a superconducting coil device according to a modified example of an embodiment.
Figure 13:
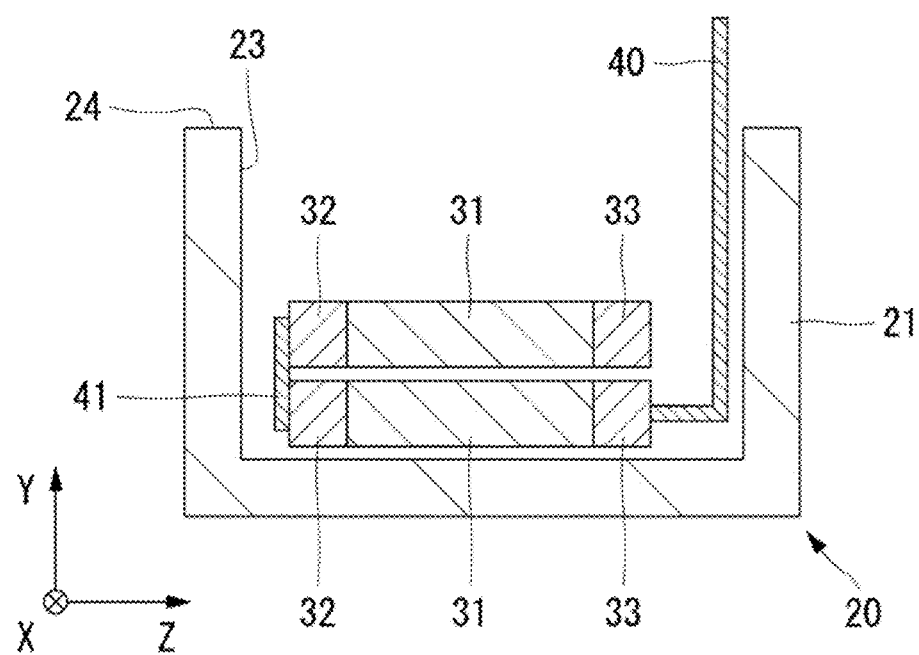
FIG. 13 is a cross-sectional view of the main part in the production process of a superconducting coil device according to a modified example of an embodiment.

FIG. 11 is a process flow diagram showing part of the production process of a superconducting coil device according to a modified example of the embodiment. FIGS. 12 and 13 are each a cross-sectional view of the main part in the production process of a superconducting coil device according to the modified example of the embodiment. In this regard, the cross sections of the main parts shown in FIGS. 12 and 13 each correspond to the cross section of the main part shown in FIG. 4.

In the production process of the superconducting coil device according to the present modified example, step S11 is performed in a similar manner as in the production process of the superconducting coil device according to the embodiment, and then as shown in FIGS. 12 and 13, and FIG. 10, a superconducting coil 30 is housed in a coil case 20 (step S21 in FIG. 11). This step S21 includes a process of housing a plurality of pancake coils each being prepared by winding a superconducting wire in a spiral form in the coil case 20, that is, in a recessed part 23 (step S22 in FIG. 11).

In this step S22, at first, as shown in FIG. 12, a first pancake coil 31 is housed in the coil case 20, that is, in the recessed part 23 (step S23 in FIG. 11).

In this step S22, next, as shown in FIG. 13, housing and connection of a pancake coil 31 is repeatedly performed (step S24 in FIG. 11). In this step S24, a process of housing the following pancake coil 31 in the coil case 20 (step S25 in FIG. 11), and a process of electrically connecting the pancake coil 31 housed in the coil case 20 to the last pancake coil 31 housed in the coil case 20 (step S26 in FIG. 11) are repeatedly performed. In this way, in step S22, a pancake coil 31 just housed is electrically connected to the last pancake coil 31 that has housed immediately before the just housed pancake coil 31 is housed, and then the following pancake coil 31 is housed.

Further, in step S21, step S22 is performed in a state that a winding axis of each of the plurality of pancake coils 31 is along the Y-axis direction. In this way, as shown in FIG. 10, a superconducting coil 30 including the plurality of pancake coils 31, each being prepared by winding a superconducting wire in a spiral form around an axis AX1 along the Y-axis direction (see FIG. 2), are disposed one on another in layers in the Y-axis direction in a coil case 20, that is, in a recessed part 23, and are connected in series, is housed in the coil case 20, that is, in the recessed part 23.

Next, a process similar to that in step S14 in FIG. 7 (step S14 in FIG. 11) is performed to fill a large gap in the coil case 20, that is, in the recessed part 23. Further, a process similar to that in step S15 in FIG. 7 (step S15 in FIG. 11) is performed to inject a polymerizable composition 52 into the coil case 20, that is, into the recessed part 23, and then a process similar to that in step S16 in FIG. 7 (step S16 in FIG. 11) is performed to polymerize and cure the polymerizable composition 52 injected into the coil case 20, that is, into the recessed part 23. In this way, a superconducting coil device 10 shown in FIG. 4 is produced.

In the production process of the superconducting coil device according to the present modified example, a plurality of pancake coils 31 can be housed one by one in the coil case 20 in a state that the plurality of pancake coils 31 are not electrically connected to each other. Therefore, the weight for conveying the coils to be housed in the coil case 20 can be reduced, as a result of which a conveyance device for conveying the coils can be reduced in size. Alternatively, since the pancake coils 31 can be conveyed one by one when housed in the coil case 20, that is, in the recessed part 23, application of large stress to the pancake coil 31 to be conveyed during the conveyance can be prevented or suppressed, and deterioration of the superconducting characteristics of a superconducting wire contained in the pancake coil 31 can be prevented or suppressed.

EXAMPLES

Hereinafter, the present embodiment will be described in more detail by way of Examples. Note that the present invention should not be limited by the following Examples.
[Preparation of Polymerizable Composition]

Production Example 1

In Production Example 1, a polymerizable composition containing a first monomer made of dicyclopentadiene and a metathesis polymerization catalyst made of the above-described compound (8) was prepared. The obtained polymerizable composition was maintained at 20° C. The amount of the metathesis polymerization catalyst used was 0.055 mmol per one mol of the total content of the monomers used. Further, the viscosity at 25° C. of the polymerizable composition was 10 mPa·s or less as measured by a B-type viscometer.

Production Example 2

In Production Example 2, a polymerizable composition containing a first monomer made of dicyclopentadiene, a second monomer made of 5-ethylidene norbornene, and a metathesis polymerization catalyst made of the above-described compound (8) was prepared. The obtained polymerizable composition was maintained at 20° C. In this regard, the content of the second monomers in the polymerizable composition was 6.4 parts by mass when the total content of the first monomers in the polymerizable composition and the second monomers in the polymerizable composition was taken as 100 parts by mass. Further, the viscosity at 25° C. of the polymerizable composition was 10 mPa·s or less as measured by a B-type viscometer. The amount of the metathesis polymerization catalyst used was 0.055 mmol per one mol of the total content of the monomers used.
[Evaluation of Polymerization and Curing of Polymerizable Composition]

Next, polymerizable compositions of Production Examples 1 and 2 were each injected into a simulated case simulating a coil case under the environment of 20° C., and left to stand until the resin flow disappeared (precuring), and then the resultant polymerizable compositions were each subjected to heat treatment under the conditions of a heating temperature of 80° C. and a heating time of one hour to be polymerized and cured, and the polymerization and curing of the polymerizable compositions of Production Examples 1 and 2 was visually evaluated. Among photographs of Production Examples 1 and 2, a photograph of the polymer obtained by polymerizing the polymerizable composition of Production Example 2 is shown in FIG. 14.

Figure 14:
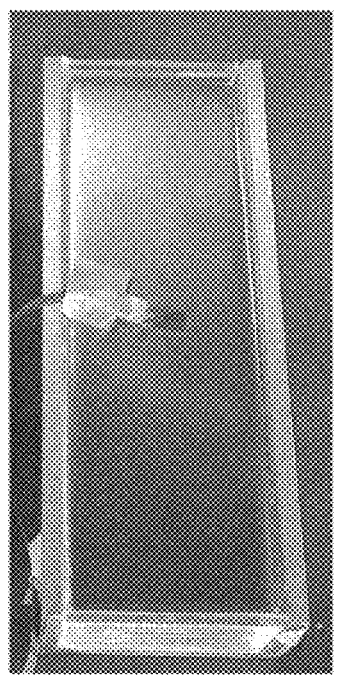
FIG. 14 is a photograph showing a polymer obtained by polymerizing a polymerizable composition according to Production Example 2.

As shown in FIG. 14, it was confirmed that the polymerizable composition of Production Example 2 was easily polymerized and cured in a state that the upper surface was flattened. Further, although the drawing was omitted, it was confirmed that the polymerizable composition of Production Example 1 was also easily polymerized and cured similarly in a state that the upper surface was flattened. As a result, it has been confirmed that in any one of the polymerizable compositions of Production Examples 1 and 2, the polymerizable composition can be sufficiently injected even into a narrow gap, and voids can be eliminated from a part between an inner wall of a coil case and a superconducting coil.

Although the detailed description is omitted, also in a case where norbornene, tetracyclododecene, 8-ethylidene tetracyclododecene, tricyclopentadiene, or another compound represented by the above-described general formula (1) was used in place of the 5-ethylidene norbornene, similar results were obtained. Accordingly, in a case where the polymerizable composition contains a first monomer made of dicyclopentadiene and a second monomer, and further, in a case where the second monomer is at least one or more kinds of the compounds represented by the above-described general formula (1), and is preferably one or more kinds selected from the group consisting of norbornene, tetracyclododecene, 5-ethylidene norbornene, 8-ethylidene tetracyclododecene, and tricyclopentadiene, it has become apparent that voids are hardly generated in a resin composition formed with polymerization and curing, and a high-quality resin composition is formed, as compared with the case where the second monomer is made of the other kinds of monomers.

Specifically, in a case where the second monomer is at least one or more kinds of the compounds represented by the above-described general formula (1), and is preferably one or more kinds selected from the group consisting of norbornene, tetracyclododecene, 5-ethylidene norbornene, 8-ethylidene tetracyclododecene, and tricyclopentadiene, as compared with the case where the second monomer is made of the other kinds of monomers, the risk of the polymerization and curing in a state that the upper surface shrinks and undulates is reduced, and the filling of the polymerizable composition in a narrow gap becomes more sufficient from the viewpoint of the shrinkage, and gaps and voids are hardly left in a part between an inner wall of a coil case and a superconducting coil.

[Preparation of Superconducting Coil Device]

Example 1

A superconducting coil 30 was housed in a coil case 20, a polymerizable composition 52 of Production Example 2 was injected into the coil case 20, and then by subjecting the polymerizable composition 52 to heat treatment to perform the polymerization and curing under the same conditions as those at the time of the evaluation of polymerization and curing of the polymerizable composition 52, a resin part 50 is formed, and a gap between an inner wall of a coil case 20 and a superconducting coil 30 was filled with the formed resin part 50. In this way, a superconducting coil device 10 of Example 1 was prepared as shown in FIG. 1.

[Evaluation of Presence or Absence of Heat Generation by Vibration Test]

Next, the superconducting coil device of Example 1 was subjected to a vibration test using a vibration test device, and the presence or absence of heat generation due to vibration in the superconducting coil device 10 was evaluated.

Figure 15:
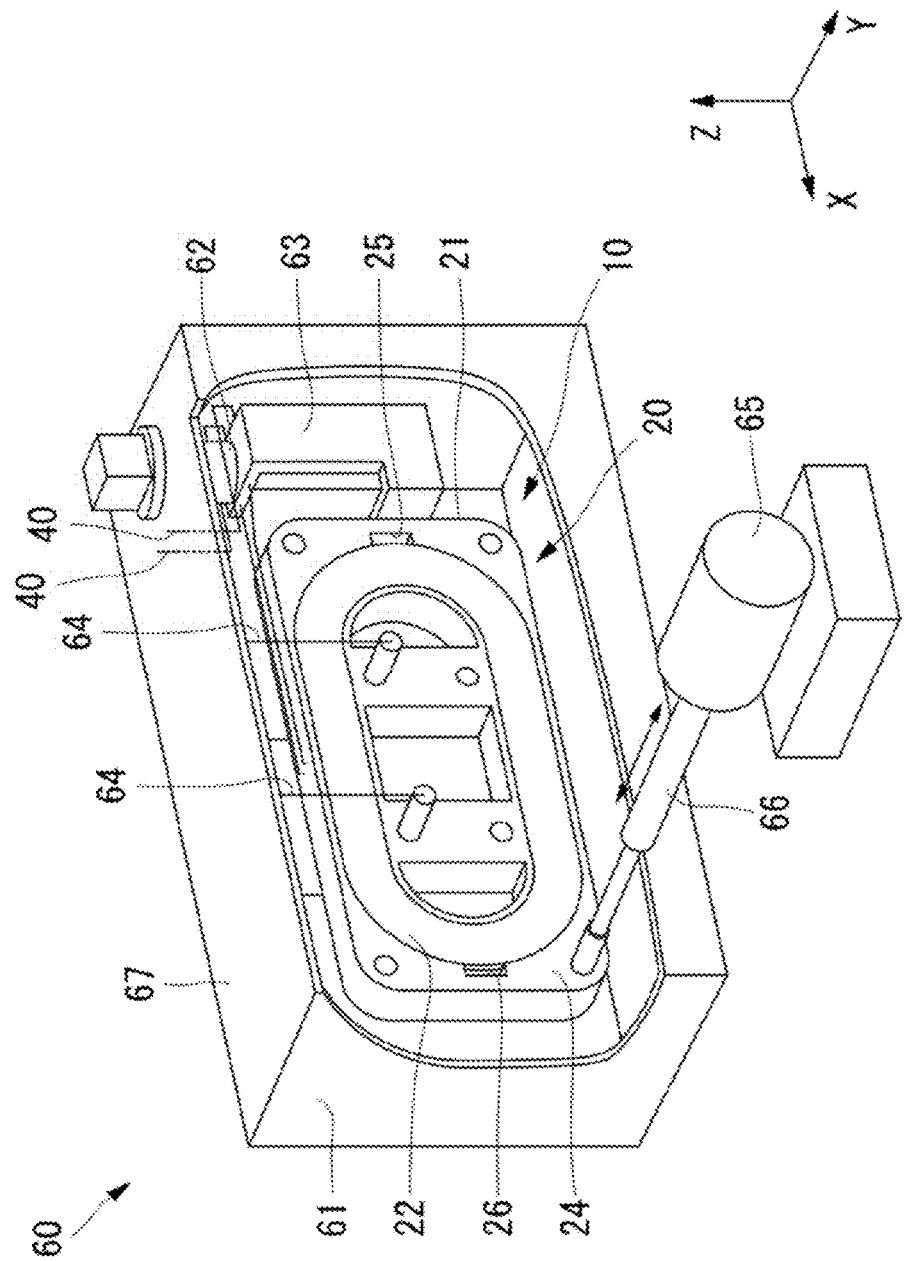
FIG. 15 is a partially cutaway perspective view showing an outline of a vibration test device.

FIG. 15 is a partially cutaway perspective view showing an outline of a vibration test device. As shown in FIG. 15, the vibration test device 60 includes a vacuum container 61, a refrigerator 62, a heat transfer plate 63, a support member 64, a vibration machine 65, and a vibration rod 66.

The vacuum container 61 is arranged so as to be evacuatable by a vacuum evacuation device (not shown). In the vacuum container 61, a superconducting coil device 10 can be arranged. The superconducting coil device 10 arranged in the vacuum container 61 is suspended from, for example, a top plate 67 of the vacuum container 61 by, for example, a support member 64 made of a member having a low thermal conductivity so as not to contact with an inner wall of the vacuum container 61. The refrigerator 62 cools the superconducting coil device 10. A coil case 20 of the superconducting coil device 10 is brought into thermally contact with the refrigerator 62 through the heat transfer plate 63. Accordingly, the refrigerator 62 cools the superconducting coil device 10 by conduction cooling through the heat transfer plate 63. As the heat transfer plate 63, for example, a laminated board in which metal plates made of high-purity aluminum are disposed in layers can be used. In this regard, two current leads 40 drawn out of the superconducting coil device 10 are further drawn out of the vacuum container 61. Further, the current leads 40 are cooled by the refrigerator 62 through the heat transfer plate 63 in the vacuum container 61.

The vibration machine 65 applies vibration force, that is, vibration, to the superconducting coil device 10. The coil case 20 of the superconducting coil device 10 is mechanically connected to the vibration machine 65 through a vibration rod 66. Therefore, the vibration machine 65 applies vibration force to the superconducting coil device 10 through the vibration rod 66.

In such a vibration test device 60, a superconducting coil device 10 of Example 1 was arranged. Further, in a state that the arranged superconducting coil device 10 of Example 1 was cooled to a temperature of around 35K, a superconducting coil 30 (see FIG. 3) was excited by energizing with 250 A of current. This energization amount was equivalent to a magnetomotive force of 700 kA. In addition, in a state that the superconducting coil 30 was excited under such a condition, vibration force was applied to a corner part of a container body part 21 of a coil case 20 by a vibration machine 65. At this time, the deformation mode of the superconducting coil device 10 was set to a bending primary mode, and the vibration frequency was set to 223 Hz. Further, the vibration force was adjusted so that the maximum acceleration was 15 G.

Figure 16:
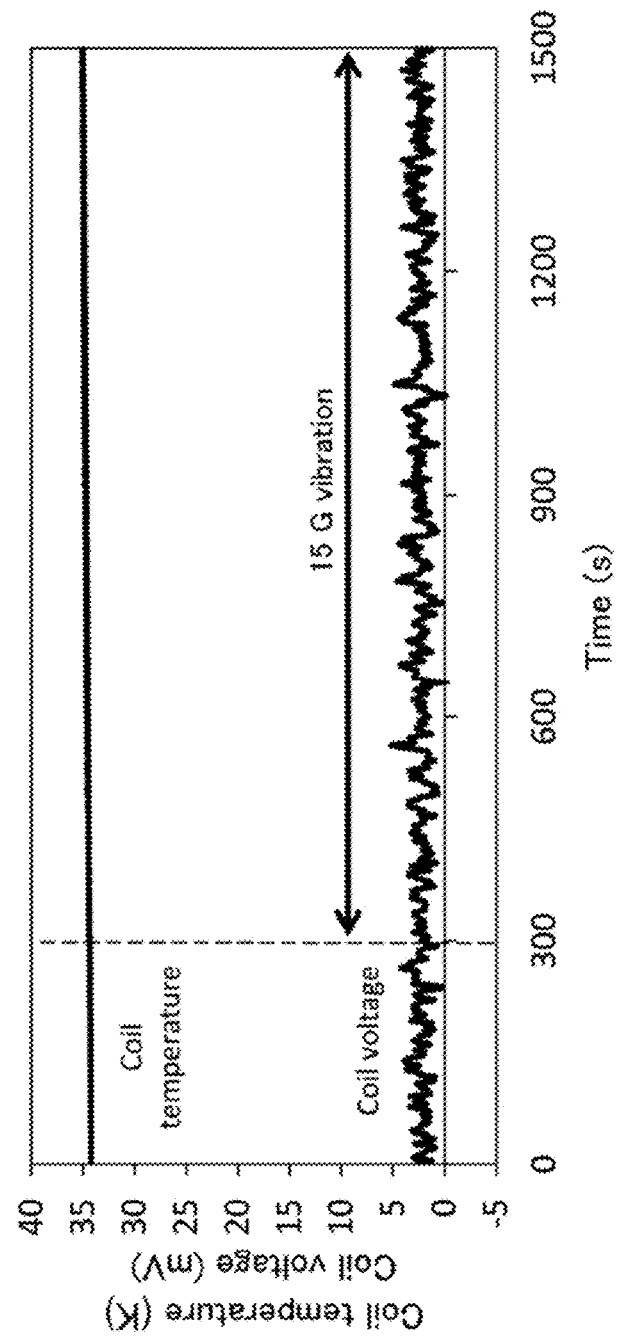
FIG. 16 is a graph showing the results of measuring temporal changes in coil temperature and coil voltage in a vibration test by using a superconducting coil device according to Example 1.

The vibration test was performed under such a condition, and the presence or absence of heat generation due to vibration was verified. Specifically, when the vibration test was performed, the temperature (coil temperature) of the superconducting coil device 10, and the voltage (coil voltage) between two outer electrodes of the superconducting coil device 10 were performed. The results are shown in FIG. 16. FIG. 16 is a graph showing the results of measuring temporal changes in the coil temperature and coil voltage in a vibration test by using a superconducting coil device according to Example 1.

As shown in FIG. 16, at first, the temperature was measured for 300 seconds in a stationary state without applying vibration, and it was confirmed whether or not the measured temperature was stable. Further, after confirming that the temperature was stable, vibration was started, and the vibration was performed for 20 minutes under the condition that the maximum acceleration was adjusted to 15G.

As shown in FIG. 16, it was found that as compared with the coil voltage before the application of the vibration, the changes in the coil voltage during the application of the vibration were not observed at all, and the excited state was stably kept. Further, the rise in the coil temperature was slow, and was 3 W or less in terms of heat load. The heat load of 3 W or less was a sufficiently small value as compared with the heat load in a stationary state without applying the vibration. Therefore, it was able to be confirmed that even during the application of the vibration, positional displacement of the superconducting coil 30 (see FIG. 3) to the coil case 20 was not generated, heat due to friction was not generated, and there was no problem in the cooling state of the superconducting coil device 10. Further, when the vibration test was terminated, the superconducting coil device 10 was heated to room temperature, and then visual inspection was performed, neither voids nor cracks were generated in a resin part 50 (see FIG. 3). In addition, although the detailed description is omitted, also in a case where norbornene, tetracyclododecene, 8-ethylidene tetracyclododecene, tricyclopentadiene, or another compound represented by the above-described general formula (1) was used in place of the 5-ethylidene norbornene, as the second monomer, results similar to those as in Example 1 were obtained.

Although the invention made by the present inventors has been specifically described above on the basis of the embodiments, the present invention is not limited to the embodiments described above, it goes without saying that various modifications may be made without departing from the gist of the present invention.

In the category of the idea of the present invention, various change examples and modification examples can be conceived by those skilled in the art, and it is understood that these change examples and modification examples also belong to the scope of the present invention.

For example, in each of the above-described embodiments, those in which the constituent elements have been appropriately added or deleted, or the design have been changed, or those in which the processes have been added or omitted, or the conditions have been changed, by those skilled in the art are also included in the scope of the present invention as long as they have the gist of the present invention.

INDUSTRIAL APPLICABILITY

The present invention is effective when applied to a superconducting coil device and a production method thereof.

REFERENCE SIGNS LIST

10 Superconducting coil device
20 Coil case
21 Container body part
22 Lid part
23 Recessed part
24 Main surface
25, and 26 Opening part
30 Superconducting coil
31 Pancake coil
32 Inner electrode
33 to 35 Outer electrode
40 Current lead
41 to 43 Connection member
50 Resin part
51 Polymer
52 Polymerizable composition
60 Vibration test device
61 Vacuum container
62 Refrigerator
63 Heat transfer plate
64 Support member
65 Vibration machine
66 Vibration rod
67 Top plate
AX1 Axis
CP1 to CP4 Curve part
EP11, EP12, EP21, and EP22 End part
EP31, EP32, EP41, and EP42 End part
LP1 to LP4 Straight line part

The invention claimed is:
1. A superconducting coil device, comprising:
a housing part housing a superconducting coil;
the superconducting coil housed in the housing part; and
a resin part filled in a gap between an inner wall of the housing part and the superconducting coil, wherein
the resin part is formed of a polymer obtained by polymerizing a polymerizable composition containing a first monomer having a norbornene ring structure, and a second monomer having a norbornene ring structure and being of a monomer different from the monomer of the first monomer,
the first monomer is made of dicyclopentadiene,
the second monomer is made of one or more selected from the group consisting of norbornene, and 5-ethylidene norbornene, and
a content of the second monomers in the polymerizable composition is 5 parts by mass or more and 45 parts by mass or less when the total content of the first monomers in the polymerizable composition and the second monomers in the polymerizable composition is 100 parts by mass.

2. The superconducting coil device according to claim 1, wherein
the superconducting coil includes a plurality of pancake coils, each being prepared by winding a superconducting wire in a spiral form around a winding axis along a first direction, the pancake coils being disposed one on another in layers in the first direction in the housing part and connected in series.

3. The superconducting coil device according to claim 2, wherein
the housing part includes:
a container body part having a recessed part; and
a lid part that closes the recessed part,
the container body part has a main surface intersecting with the first direction,
the recessed part is formed on the main surface, and
the plurality of pancake coils are disposed one on another in layers in the recessed part.

4. The superconducting coil device according to claim 1, wherein
the housing part is formed of an aluminum alloy, stainless steel, or glass fiber reinforced plastic (GFRP).

5. A method for producing a superconducting coil device, comprising the steps of:
(a) housing a superconducting coil in a housing part that houses the superconducting coil;
(b) injecting a polymerizable composition into the housing part after the step (a); and
(c) polymerizing the polymerizable composition after the step (b), and filling a gap between an inner wall of the housing part and the superconducting coil with a resin part formed of a polymer of the polymerizable composition, wherein
the polymerizable composition contains a first monomer having a norbornene ring structure, and a second monomer having a norbornene ring structure and being of a monomer different from the monomer of the first monomer,
the first monomer is made of dicyclopentadiene,
the second monomer is made of one or more selected from the group consisting of norbornene, and 5-ethylidene norbornene, and
a content of the second monomers in the polymerizable composition is 5 parts by mass or more and 45 parts by mass or less when the total content of the first monomers in the polymerizable composition and the second monomers in the polymerizable composition is 100 parts by mass.

6. The method for producing a superconducting coil device according to claim 5, wherein
in the step (b), the polymerizable composition having a viscosity of 100 mPa·s or less at 25° C. is injected, and
in the step (c), the polymerizable composition is polymerized at a temperature of 250° C. or less.

7. The method for producing a superconducting coil device according to claim 5, wherein
the step (a) includes the step of
(a1) housing a plurality of pancake coils each being prepared by winding a superconducting wire in a spiral form in the housing part,
in the step (a1), a pancake coil just housed is electrically connected to the last pancake coil housed immediately before the just housed pancake coil is housed, and then the following pancake coil is housed,
in the step (a), by performing the step (a1) in a state that a winding axis of each of the plurality of pancake coils is along a first direction, a superconducting coil containing the plurality of pancake coils, each being prepared by winding a superconducting wire in a spiral form around the winding axis along the first direction, the pancake coils being disposed one on another in layers in the first direction and connected in series is housed.

8. The method for producing a superconducting coil device according to claim 7, wherein
the housing part includes:
a container body part having a recessed part; and
a lid part that closes the recessed part,
the container body part has a main surface intersecting with the first direction,
the recessed part is formed on the main surface, and
in the step (a1), the plurality of pancake coils are housed in the recessed part.

9. The method for producing a superconducting coil device according to claim 8, wherein
the container body part includes:
a first opening part formed on the main surface, arranged closer to a first side than the recessed part in a second direction intersecting with the first direction, and communicated with the recessed part; and
a second opening part formed on the main surface, arranged closer to an opposite side of the first side than the recessed part in the second direction, and communicated with the recessed part, and
the step (b) includes the steps of:
(b1) closing the recessed part with the lid part;
(b2) after the step (b1), starting injection of the polymerizable composition from the first opening part into the recessed part in a state that the main surface is tilted with respect to a horizontal plane so that a position of the first opening part is higher than that of the second opening part; and
(b3) after the step (b2), injecting the polymerizable composition from the first opening part into the recessed part while decreasing a tilting angle of the main surface with respect to the horizontal plane.

10. A method for producing a superconducting coil device, comprising the steps of:
(a) housing a superconducting coil in a housing part that houses the superconducting coil;
(b) injecting a polymerizable composition into the housing part after the step (a); and
(c) polymerizing the polymerizable composition after the step (b), and filling a gap between an inner wall of the housing part and the superconducting coil with a resin part formed of a polymer of the polymerizable composition, wherein
the polymerizable composition contains a first monomer having a norbornene ring structure,
the step (a) includes the step of
(a1) housing a plurality of pancake coils each being prepared by winding a superconducting wire in a spiral form in the housing part,
in the step (a1), a pancake coil just housed is electrically connected to the last pancake coil housed immediately before the just housed pancake coil is housed, and then the following pancake coil is housed,
in the step (a), by performing the step (a1) in a state that a winding axis of each of the plurality of pancake coils is along a first direction, a superconducting coil containing the plurality of pancake coils, each being prepared by winding a superconducting wire in a spiral form around the winding axis along the first direction, the pancake coils being disposed one on another in layers in the first direction and connected in series is housed,
the housing part includes:
a container body part having a recessed part; and
a lid part that closes the recessed part,
the container body part has a main surface intersecting with the first direction,
the recessed part is formed on the main surface, and
in the step (a1), the plurality of pancake coils are housed in the recessed part, the container body part includes:
a first opening part formed on the main surface, arranged closer to a first side than the recessed part in a second direction intersecting with the first direction, and communicated with the recessed part; and
a second opening part formed on the main surface, arranged closer to an opposite side of the first side than the recessed part in the second direction, and communicated with the recessed part, and
the step (b) includes the steps of:
(b1) closing the recessed part with the lid part;
(b2) after the step (b1), starting injection of the polymerizable composition from the first opening part into the recessed part in a state that the main surface is tilted with respect to a horizontal plane so that a position of the first opening part is higher than that of the second opening part; and
(b3) after the step (b2), injecting the polymerizable composition from the first opening part into the recessed part while decreasing a tilting angle of the main surface with respect to the horizontal plane.

\* \* \* \* \*